US012603639B2

(12) United States Patent
Cardona et al.

(10) Patent No.: US 12,603,639 B2
(45) Date of Patent: Apr. 14, 2026

(54) METAL CAVITY FOR TRANSVERSELY-EXCITED FILM BULK ACOUSTIC RESONATOR (XBAR)

(71) Applicant: Murata Manufacturing Co., Ltd., Nagaokakyo (JP)

(72) Inventors: Albert Cardona, Santa Barbara, CA (US); Andrew Kay, Provo, UT (US); Chris O'Brien, San Diego, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 880 days.

(21) Appl. No.: 17/878,696

(22) Filed: Aug. 1, 2022

(65) Prior Publication Data

US 2023/0037168 A1 Feb. 2, 2023

Related U.S. Application Data

(60) Provisional application No. 63/228,549, filed on Aug. 2, 2021.

(51) Int. Cl.
 *H03H 9/17* (2006.01)
 *H03H 3/02* (2006.01)
(52) U.S. Cl.
 CPC .............. *H03H 9/171* (2013.01); *H03H 3/02* (2013.01); *H03H 9/172* (2013.01); *H03H 9/173* (2013.01)
(58) Field of Classification Search
 CPC .......................... H03H 9/171–173; H03H 3/02
 USPC .................. 333/186–187; 310/311, 324, 349
 See application file for complete search history.

(56) References Cited

U.S. PATENT DOCUMENTS

| | | | |
|---|---|---|---|
| 5,204,575 A | 4/1993 | Kanda et al. | |
| 5,274,345 A | 12/1993 | Gau | |
| 5,446,330 A | 8/1995 | Eda et al. | |
| 5,552,655 A | 9/1996 | Stokes et al. | |
| 5,726,610 A | 3/1998 | Allen et al. | |
| 5,729,186 A | 3/1998 | Seki et al. | |

(Continued)

FOREIGN PATENT DOCUMENTS

| | | |
|---|---|---|
| WO | 2016017104 | 2/2016 |
| WO | 2018003273 | 1/2018 |

OTHER PUBLICATIONS

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

(Continued)

*Primary Examiner* — Andrea Lindgren Baltzell
*Assistant Examiner* — Victor Cole
(74) *Attorney, Agent, or Firm* — ArentFox Schiff LLP

(57) ABSTRACT

A process for fabricating a transversely-excited film bulk acoustic resonator (XBAR) having a metal cavity, and the fabricated XBAR include forming a conductor pattern including interleaved interdigital transducer (IDT) fingers on a piezoelectric wafer. Thein forming a metal layer on a substrate, the metal layer having a cavity. Then, bonding the piezoelectric plate to the metal layer using a metal-to-metal bond such that the IDT fingers are disposed over the cavity. Then, thinning the piezoelectric wafer to form a piezoelectric plate having a portion of the piezoelectric plate forming a diaphragm that spans the cavity.

11 Claims, 23 Drawing Sheets

(56) References Cited

U.S. PATENT DOCUMENTS

| | | | |
|---|---|---|---|
| 5,801,069 A * | 9/1998 | Harada | H03H 9/174 438/52 |
| 5,853,601 A | 12/1998 | Krishaswamy | |
| 6,172,582 B1 | 1/2001 | Hickernell | |
| 6,271,617 B1 | 8/2001 | Yoneda et al. | |
| 6,377,140 B1 | 4/2002 | Ehara et al. | |
| 6,516,503 B1 | 2/2003 | Ikada et al. | |
| 6,540,827 B1 | 4/2003 | Levy et al. | |
| 6,570,470 B2 | 5/2003 | Maehara et al. | |
| 6,707,229 B1 | 3/2004 | Martin | |
| 6,710,514 B2 | 3/2004 | Ikada et al. | |
| 6,833,774 B2 | 12/2004 | Abbott et al. | |
| 7,009,468 B2 | 3/2006 | Kadota et al. | |
| 7,345,400 B2 | 3/2008 | Nakao et al. | |
| 7,463,118 B2 | 12/2008 | Jacobsen | |
| 7,535,152 B2 | 5/2009 | Ogami et al. | |
| 7,684,109 B2 | 3/2010 | Godshalk et al. | |
| 7,728,483 B2 | 6/2010 | Tanaka | |
| 7,868,519 B2 | 1/2011 | Umeda | |
| 7,941,103 B2 | 5/2011 | Iwamoto et al. | |
| 7,965,015 B2 | 6/2011 | Tai et al. | |
| 8,278,802 B1 | 10/2012 | Lee et al. | |
| 8,294,330 B1 | 10/2012 | Abbott et al. | |
| 8,344,815 B2 | 1/2013 | Yamanaka et al. | |
| 8,816,567 B2 | 8/2014 | Zuo et al. | |
| 8,829,766 B2 | 9/2014 | Milyutin et al. | |
| 8,932,686 B2 | 1/2015 | Hayakawa et al. | |
| 9,093,979 B2 | 7/2015 | Wang | |
| 9,112,134 B2 | 8/2015 | Takahashi | |
| 9,130,145 B2 | 9/2015 | Martin et al. | |
| 9,148,121 B2 | 9/2015 | Inoue | |
| 9,219,466 B2 | 12/2015 | Meltaus et al. | |
| 9,276,557 B1 | 3/2016 | Nordquist et al. | |
| 9,369,105 B1 | 6/2016 | Li et al. | |
| 9,425,765 B2 | 8/2016 | Rinaldi | |
| 9,525,398 B1 | 12/2016 | Olsson | |
| 9,640,750 B2 | 5/2017 | Nakanishi et al. | |
| 9,748,923 B2 | 8/2017 | Kando et al. | |
| 9,762,202 B2 | 9/2017 | Thalmayr et al. | |
| 9,780,759 B2 | 10/2017 | Kimura et al. | |
| 9,837,984 B2 | 12/2017 | Khlat et al. | |
| 10,079,414 B2 | 9/2018 | Guyette et al. | |
| 10,187,039 B2 | 1/2019 | Komatsu et al. | |
| 10,200,013 B2 | 2/2019 | Bower et al. | |
| 10,211,806 B2 | 2/2019 | Bhattacharjee | |
| 10,284,176 B1 | 5/2019 | Solal | |
| 10,476,469 B2 | 11/2019 | Gong et al. | |
| 10,491,192 B1 | 11/2019 | Plesski et al. | |
| 10,601,392 B2 | 3/2020 | Plesski et al. | |
| 10,637,438 B2 | 4/2020 | Garcia et al. | |
| 10,644,674 B2 | 5/2020 | Takamine | |
| 10,756,697 B2 | 8/2020 | Plesski et al. | |
| 10,790,802 B2 | 9/2020 | Yantchev et al. | |
| 10,797,675 B2 | 10/2020 | Plesski | |
| 10,812,048 B2 | 10/2020 | Nosaka | |
| 10,819,309 B1 | 10/2020 | Turner et al. | |
| 10,826,462 B2 | 11/2020 | Plesski et al. | |
| 10,868,510 B2 | 12/2020 | Yantchev et al. | |
| 10,868,512 B2 | 12/2020 | Garcia et al. | |
| 10,868,513 B2 | 12/2020 | Yantchev | |
| 10,911,017 B2 | 2/2021 | Plesski | |
| 10,911,021 B2 | 2/2021 | Turner et al. | |
| 10,911,023 B2 | 2/2021 | Turner | |
| 10,917,070 B2 | 2/2021 | Plesski et al. | |
| 10,917,072 B2 | 2/2021 | McHugh et al. | |
| 10,985,726 B2 | 4/2021 | Plesski | |
| 10,985,728 B2 | 4/2021 | Plesski et al. | |
| 10,985,730 B2 | 4/2021 | Garcia | |
| 10,992,282 B1 | 4/2021 | Plesski et al. | |
| 10,992,283 B2 | 4/2021 | Plesski et al. | |
| 10,992,284 B2 | 4/2021 | Yantchev | |
| 10,998,877 B2 | 5/2021 | Turner et al. | |
| 10,998,882 B2 | 5/2021 | Yantchev et al. | |
| 11,003,971 B2 | 5/2021 | Plesski et al. | |
| 11,114,996 B2 | 9/2021 | Plesski et al. | |
| 11,114,998 B2 | 9/2021 | Garcia et al. | |
| 11,139,794 B2 | 10/2021 | Plesski et al. | |
| 11,143,561 B2 | 10/2021 | Plesski | |
| 11,146,231 B2 | 10/2021 | Plesski | |
| 11,146,232 B2 | 10/2021 | Yandrapalli et al. | |
| 11,146,238 B2 | 10/2021 | Hammond et al. | |
| 11,146,244 B2 | 10/2021 | Yantchev | |
| 11,165,407 B2 | 11/2021 | Yantchev | |
| 11,171,629 B2 | 11/2021 | Turner | |
| 11,201,601 B2 | 12/2021 | Yantchev et al. | |
| 11,206,009 B2 | 12/2021 | Plesski | |
| 11,228,296 B2 | 1/2022 | Dyer | |
| 11,239,816 B1 | 2/2022 | McHugh | |
| 11,239,822 B2 | 2/2022 | Garcia | |
| 11,264,966 B2 | 3/2022 | Yantchev | |
| 11,264,969 B1 | 3/2022 | Fenzi | |
| 11,271,539 B1 | 3/2022 | Yantchev | |
| 11,271,540 B1 | 3/2022 | Yantchev | |
| 11,283,424 B2 | 3/2022 | Turner | |
| 11,309,865 B1 | 4/2022 | Guyette | |
| 11,323,089 B2 | 5/2022 | Turner | |
| 11,323,090 B2 | 5/2022 | Garcia | |
| 11,323,091 B2 | 5/2022 | Kay | |
| 11,323,095 B2 | 5/2022 | Garcia | |
| 11,323,096 B2 | 5/2022 | Yantchev | |
| 11,349,450 B2 | 5/2022 | Yantchev | |
| 11,349,452 B2 | 5/2022 | Yantchev | |
| 11,356,077 B2 | 6/2022 | Garcia | |
| 11,368,139 B2 | 6/2022 | Garcia | |
| 11,374,549 B2 | 6/2022 | Yantchev | |
| 11,381,221 B2 | 7/2022 | McHugh | |
| 2002/0079986 A1 | 6/2002 | Ruby et al. | |
| 2002/0130736 A1 | 9/2002 | Mukai | |
| 2002/0158714 A1 | 10/2002 | Kaitila et al. | |
| 2002/0189062 A1 | 12/2002 | Lin et al. | |
| 2003/0042998 A1 | 3/2003 | Edmonson | |
| 2003/0080831 A1 | 5/2003 | Naumenko et al. | |
| 2003/0199105 A1 | 10/2003 | Kub et al. | |
| 2004/0041496 A1 | 3/2004 | Imai et al. | |
| 2004/0100164 A1 | 5/2004 | Murata | |
| 2004/0261250 A1 | 12/2004 | Kadota et al. | |
| 2005/0077982 A1 | 4/2005 | Funasaka | |
| 2005/0185026 A1 | 8/2005 | Noguchi et al. | |
| 2005/0218488 A1 | 10/2005 | Matsuo | |
| 2005/0264136 A1 | 12/2005 | Tsutsumi et al. | |
| 2006/0152107 A1 | 7/2006 | Tanaka | |
| 2006/0179642 A1 | 8/2006 | Kawamura | |
| 2007/0182510 A1 | 8/2007 | Park | |
| 2007/0188047 A1 | 8/2007 | Tanaka | |
| 2007/0194863 A1 | 8/2007 | Shibata et al. | |
| 2007/0267942 A1 | 11/2007 | Matsumoto et al. | |
| 2008/0246559 A1 | 10/2008 | Ayazi | |
| 2010/0019866 A1 | 1/2010 | Hara et al. | |
| 2010/0064492 A1 | 3/2010 | Tanaka | |
| 2010/0123367 A1 | 5/2010 | Tai et al. | |
| 2011/0018389 A1 | 1/2011 | Fukano et al. | |
| 2011/0018654 A1 | 1/2011 | Bradley et al. | |
| 2011/0109196 A1 | 5/2011 | Goto et al. | |
| 2011/0254406 A1 | 10/2011 | Yamane | |
| 2011/0278993 A1 | 11/2011 | Iwamoto | |
| 2012/0073390 A1 | 3/2012 | Zaghloul et al. | |
| 2012/0198672 A1 | 8/2012 | Ueda et al. | |
| 2012/0286900 A1 | 11/2012 | Kadota et al. | |
| 2012/0326809 A1 | 12/2012 | Tsuda | |
| 2013/0127551 A1 | 5/2013 | Yamanaka | |
| 2013/0234805 A1 | 9/2013 | Takahashi | |
| 2013/0271238 A1 | 10/2013 | Onda | |
| 2013/0278609 A1 | 10/2013 | Stephanou et al. | |
| 2013/0321100 A1 | 12/2013 | Wang | |
| 2014/0130319 A1 | 5/2014 | Iwamoto | |
| 2014/0145556 A1 | 5/2014 | Kadota | |
| 2014/0151151 A1 | 6/2014 | Reinhardt | |
| 2014/0152145 A1 | 6/2014 | Kando et al. | |
| 2014/0173862 A1 | 6/2014 | Kando et al. | |
| 2014/0225684 A1 | 8/2014 | Kando et al. | |
| 2015/0014795 A1 | 1/2015 | Franosch | |
| 2015/0042417 A1 | 2/2015 | Onodera et al. | |
| 2015/0165479 A1 | 6/2015 | Lasiter et al. | |
| 2015/0319537 A1 | 11/2015 | Perois et al. | |

(56) References Cited

U.S. PATENT DOCUMENTS

| | | |
|---|---|---|
| 2015/0333730 A1 | 11/2015 | Meltaus et al. |
| 2015/0365067 A1 | 12/2015 | Hori et al. |
| 2016/0028367 A1 | 1/2016 | Shealy |
| 2016/0087187 A1 | 3/2016 | Burak |
| 2016/0182009 A1 | 6/2016 | Bhattacharjee |
| 2017/0063332 A1 | 3/2017 | Gilbert et al. |
| 2017/0179225 A1 | 6/2017 | Kishimoto |
| 2017/0179928 A1 | 6/2017 | Raihn et al. |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0370791 A1 | 12/2017 | Nakamura et al. |
| 2018/0005950 A1 | 1/2018 | Watanabe |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1 | 5/2018 | Gong |
| 2018/0191322 A1 | 7/2018 | Chang et al. |
| 2018/0262179 A1 | 9/2018 | Goto |
| 2018/0278227 A1 | 9/2018 | Hurwitz |
| 2018/0278238 A1* | 9/2018 | Kuroyanagi ............. H03H 9/70 |
| 2018/0309426 A1 | 10/2018 | Guenard |
| 2019/0044498 A1 | 2/2019 | Kawasaki |
| 2019/0068164 A1 | 2/2019 | Houlden et al. |
| 2019/0123721 A1 | 4/2019 | Takamine |
| 2019/0131953 A1 | 5/2019 | Gong |
| 2019/0190487 A1 | 6/2019 | Yasuda |
| 2019/0253038 A1 | 8/2019 | Houlden |
| 2019/0273480 A1 | 9/2019 | Lin et al. |
| 2019/0305750 A1* | 10/2019 | Bulger ..................... H03H 3/08 |
| 2019/0348966 A1 | 11/2019 | Campanella-Pineda |
| 2019/0379351 A1 | 12/2019 | Miyamoto et al. |
| 2019/0386635 A1 | 12/2019 | Plesski et al. |
| 2019/0386636 A1 | 12/2019 | Plesski et al. |
| 2020/0007110 A1 | 1/2020 | Konaka et al. |
| 2020/0021272 A1 | 1/2020 | Segovia Fernandez et al. |
| 2020/0036357 A1 | 1/2020 | Mimura |
| 2020/0083861 A1 | 3/2020 | Matsuo |
| 2020/0235719 A1 | 7/2020 | Yantchev et al. |
| 2020/0259480 A1 | 8/2020 | Pensala |
| 2020/0274520 A1 | 8/2020 | Shin |
| 2020/0313645 A1 | 10/2020 | Caron |
| 2020/0350891 A1 | 11/2020 | Turner |
| 2020/0412328 A1* | 12/2020 | Turner ................... H10N 30/06 |
| 2021/0013859 A1 | 1/2021 | Turner et al. |
| 2021/0152154 A1 | 5/2021 | Tang |
| 2021/0265978 A1 | 8/2021 | Plesski et al. |
| 2021/0328574 A1 | 10/2021 | Garcia |
| 2021/0351762 A1 | 11/2021 | Dyer et al. |

OTHER PUBLICATIONS

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Bai et al. "The Simulation of Resonant Mode and Effective Electromechanical Coupling Coefficient of Lithium Niobate Crystal with Different Orientations", J. Phys.: Conf. Ser. 1637 012064, 2020 (Year: 2020).

Buchanan "Ceramic Materials for Electronics" 3rd Edition, first published in 2004 by Marcel Dekker, Inc. pp. 496 (Year 2004). 00 Jan. 2004.

Ekeom, D. & Dubus, Bertrand & Volatier, A . . . (2006). Solidly mounted resonator (SMR) FEM-BEM simulation. 1474-1477. 10.1109/ULTSYM.2006.371.

G. Manohar, "Investigation of Various Surface Acoustic Wave Design Configurations for Improved Sensitivity." Doctoral dissertation, University of South Florida, USA, Jan. 2012, 7 pages.

Gnewuch, et al. "Broadband monolithic acousto-optic tunable filter", Mar. 1, 2000 / vol. 25, No. 5 / Optics Letters (Year: 2000).

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

Kadota et al., "Ultra-Wideband Ladder Filter Using SH0 Plate Wave in Thin LiNbO3 Plate and Its Application to Tunable Filter", IEEE Transactions on Ultrasonics, Ferroelectrics, and Frequency Control, vol. 62, No. 5, May 2015, pp. 939-946 (Year: 2015).

Lin et al., "A novel weighted method for layered SAW filters using slanted finger interdigital transducers", J. Phys. D: Appl. Phys. 39 (2006) pp. 466-470 (Year: 2006).

M. Kadota et al.; "Ultrawide Band Ladder Filter using SH0 plate Wave in Thin LiNb03 Plate and its Application"; 2014 IEEE International Ultrasonics Symposium Proceedings, 2014, pp. 2031-2034. (Year: 2014).

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

M.-H. Li et al.; "Temperature Stability Analysis of Thin-Film Lithium Niobate SH0 Plate Wave Resonators"; Journal of Microelectromechanical Systems, vol. 28, No. 5, Oct. 2019, pp. 799-809. (Year: 2019).

Material Properties of Tibtech Innovations, © 2018 TIBTECH Innovations (Year 2018). 2018.

Merriam Webster, dictionary meaning of the word "diaphragm", since 1828, Merriam Webster (Year: 1828) 1828.

Mizutaui, K. and Toda, K., "Analysis of lamb wave propagation characteristics in rotated Ycut Xpropagation LiNbO3 plates." Electron. Comm. Jpn. Pt. 1, 69, No. 4 (1986): 47-55. doi:10.1002/ecja.4410690406.

Moussa et al. Review on Triggered Liposomal Drug Delivery with a Focus on Ultrasound 2015, Bentham Science Publishers, pp. 16 (Year 2005) 2005.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Naumenko et al., "Optimal orientations of Lithium Niobate for resonator SAW filters", 2003 IEEE Ultrasonics Symposium—pp. 2110-2113. (Year: 2003).

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

Reinhardt, "Acoustic filters based on thin single crystal LiNbQ,3 films: status and prospects", 2014 IEEE International Ultrasonics Symposium Proceedings, pp. 773-781 (Year: 2014).

Rodriguez-Madrid et al., "Super-High-Frequency SAW Resonators on AIN/Diamond", IEEE Electron Device Letters, vol. 33, No. 4, Apr. 2012, pp. 495-497. Year: 2012) 2012.

Safari et al. "Piezoelectric for Transducer Applications" published by Elsevier Science Ltd., pp. 4 (Year: 2000). 2020.

Santosh, G. , Surface acoustic wave devices on silicon using patterned and thin film ZnO, Ph.D. thesis, Feb. 2016, Indian Institute of technology Guwahati, Assam, India Feb. 2016.

Sinha et al., "Slanted finger Inter-digital Transducers for the design of improved performance small shape factor mid-bandwidth SAW filters", IEEE MTT-S International Microwave and RF Conference, 2013. (Year: 2013).

Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) 00 Jan. 2015.

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

USPTO/ISA, International Search Report and Written Opinion for PCT Application No. PCT/US2020/45654 dated Oct. 29, 2020.

(56) References Cited

OTHER PUBLICATIONS

USPTO/ISA, International Search Report and Written Opinion for PCT Application No. PCT/US2021/024824 dated Jul. 27, 2021, 9 total pages.

USPTO/ISA, International Search Report and Written Opinion for PCT Application No. PCT/US2021/048505 dated Dec. 1, 2021, 11 total pages.

Wu et al., "Frequency band-gap measurement of two-dimensional air/silicon phononic crystals using layered slanted finger interdigital transducers", J. Appl. Phys. 97, 094916, 2005 (Year: 2005).

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

Zou, Jie "High-Performance Aluminum Nitride Lamb Wave Resonators for RF Front-End Technology" University of California, Berkeley, Summer 2015, p. 63 (Year 2015) 00 Jan. 2015.

* cited by examiner

DETAIL C

SECTION A-A

© 2022 RESONANT INC.

500 continued

From FIG. 5D

Post Fabrication Tuning
by Dielectric Deposition
and Patterning
5800

© 2022 RESONANT INC.

© 2022 RESONANT INC.

© 2022 RESONANT INC.

600 continued

From FIG. 6D

Post Fabrication Tuning
by Dielectric Deposition
and Patterning
6800

© 2022 RESONANT INC.

700 continued

From FIG. 7D

Post Fabrication Tuning
by Ion Milling
7700

To FIG. 7F 700,continued

From FIG. 7E

Post Fabrication Tuning
by Dielectric Deposition
and Patterning
7800

©2022 RESONANT INC.

900

METAL CAVITY FOR TRANSVERSELY-EXCITED FILM BULK ACOUSTIC RESONATOR (XBAR)

RELATED APPLICATION INFORMATION

This patent claims priority to co-pending U.S. provisional patent application No. 63/228,549, titled METAL CAVITY METHOD FOR LN MEMBRANES, filed Aug. 2, 2021.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc.

These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 1300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

Figure 1:
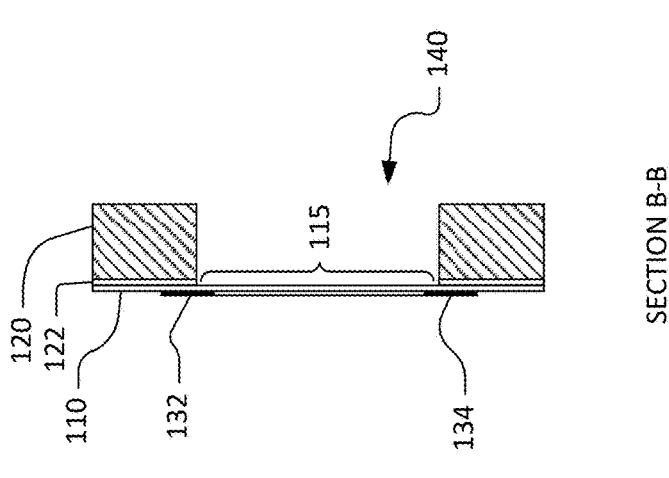
FIG. 1 includes a schematic plan view and two schematic cross-sectional views of a transversely-excited film bulk acoustic resonator (XBAR).
Figure 1:
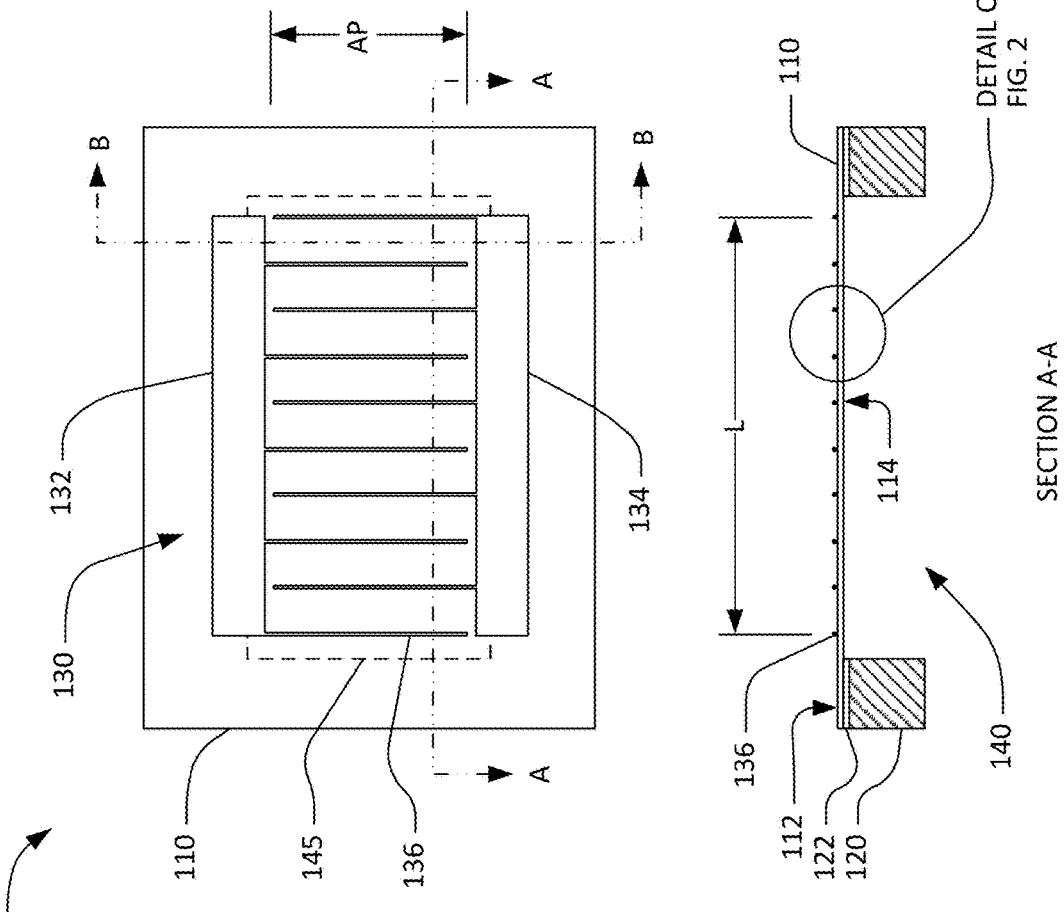

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator or the same two least significant digits.

DETAILED DESCRIPTION

Description of Apparatus

The Transversely-Excited Film Bulk Acoustic Resonator (XBAR) is a new resonator structure for use in microwave filters. The XBAR is described in U.S. Pat. No. 10,491,291, titled TRANSVERSELY EXCITED FILM BULK ACOUSTIC RESONATOR, which is incorporated herein by reference in its entirety. An XBAR resonator comprises a conductor pattern having an interdigital transducer (IDT) formed on a thin floating layer or diaphragm of a piezoelectric material. The IDT has two busbars which are each attached to a set of fingers and the two sets of fingers are interleaved on the diaphragm over a cavity formed in a substrate upon which the resonator is mounted. The diaphragm spans the cavity and may include front-side and/or back-side dielectric layers. A microwave signal applied to the IDT excites a shear primary acoustic wave in the piezoelectric diaphragm, such that the acoustic energy flows substantially normal to the surfaces of the layer, which is orthogonal or transverse to the direction of the electric field generated by the IDT. XBAR resonators provide very high electromechanical coupling and high frequency capability.

A piezoelectric membrane may be a part of a plate of single-crystal piezoelectric material that spans a cavity in the substrate. A piezoelectric diaphragm may be the membrane and may include the front-side and/or back-side dielectric layers. An XBAR resonator may be such a diaphragm or membrane with an interdigital transducer (IDT) formed on the diaphragm or membrane. Contact pads can be formed at selected locations over the surface of the substrate to provide electrical connections between the IDT and contact bumps to be attached to or formed on the contact pads.

Currently XBAR fabrication processes may be divided into two broad categories known as "the front-side etch option" or front-side membrane release (FSMR) process, and the "backside etch option" or backside membrane release (BSMR) process. With the front-side etch option, the piezoelectric plate is attached to a substrate and the diaphragm portion of the piezoelectric plate floats over a cavity (the "swimming pool") formed by etching away a tub (e.g., a thickness of an area like a bathtub) of the substrate or a sacrificial material using an etchant introduced through holes in the piezoelectric plate to form the cavity. With the backside etch option, the piezoelectric plate is attached to a substrate and the diaphragm portion of the piezoelectric plate floats over a cavity etched through the substrate and possibly a sacrificial tub from the back side (i.e. the side of the substrate that is opposite the piezoelectric plate).

The following describes improved XBAR resonators, filters and fabrication techniques for metal cavity XBAR resonators, such as accomplished by forming a metal layer on a substrate, forming a cavity in the metal layer, and bonding a piezoelectric plate to a device substrate using a metal-to-metal bond such that IDT fingers on the plate are disposed over the cavity. The metal cavity may be or be part of a FSMR process that provides a lower cost, more controllable approach for XBAR devices as compared to a BSMR process.

Some BSMR processes use a deep reactive ion etching technique to remove the (e.g., Si) substrate underneath the (e.g., LN) membrane and the etching time increases with substrate thickness. Thus, this BSMR process requires more time, resources and cost than the FSMR processes. The FSMR process herein eliminates the backside etch processing and requirements.

Another approach is to use a FSMR techniques that requires, 1) sacrificial cavity material which will need to be etched away at a later process step to form the cavity, or 2) a buried oxide layer to form an adhesion layer between the membrane and the substrate. The metal cavity XBAR resonators do not need to use sacrificial cavity material and rely upon a direct metal-to-metal bond to connect the membrane and substrate. Thus, they do not require less time, resources and cost than these other approach is to use a FSMR.

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut (which is to say the Z axis is normal to the front and back surfaces 112, 114), rotated Z-cut, or rotated YX cut. XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The substrate may have layers of silicon thermal oxide (TOX) and crystalline silicon. The substrate may be or include a thermally formed SiO2, sputter formed SiO2 and/or plasma-enhanced chemical vapor deposition (PECVD) formed SiO2. The back surface 114 of the piezoelectric plate 110 may be bonded to the substrate 120 using a wafer bonding process, or grown on the substrate 120, or attached to the substrate in some other manner. The piezoelectric plate is attached directly to the substrate or may be attached to the substrate via a bonding oxide layer 122, such as a bonding oxide (BOX) layer of SiO2, or another oxide such as Al2O3.

As shown in FIG. 1, the diaphragm 115 is contiguous with the rest of the piezoelectric plate 110 around all of a perimeter 145 of the cavity 1. In this context, "contiguous" means "continuously connected without any intervening item". However, it is possible for a bonding oxide layer (BOX) to bond the plate 110 to the substrate 120. The BOX layer may exist between the plate and substrate around perimeter 145 and may extend further away from the cavity than just within the perimeter itself. In the absence of a process to remove it (i.e., this invention) the BOX is everywhere between the piezoelectric plate and the substrate. The BOX is typically removed from the back of the diaphragm 115 as part of forming the cavity.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers 136 overlap for a distance AP, commonly referred to as the "aperture" of the IDT. The center-to-center distance L between the outermost fingers of the IDT 130 is the "length" of the IDT.

The first and second busbars 132, 134 serve as the terminals or electrodes of the XBAR 100. A radio frequency or microwave signal applied between the two busbars 132, 134 of the IDT 130 excites a primary acoustic mode within the piezoelectric plate 110. As will be discussed in further detail, the excited primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

A cavity 140 is formed in the substrate 120 such that a portion 115 of the piezoelectric plate 110 containing the IDT 130 is suspended over the cavity 140 without contacting the substrate 120 or the bottom of the cavity. "Cavity" has its conventional meaning of "an empty space within a solid body." The cavity may contain a gas, air, or a vacuum. In some case, there is also a second substrate, package or other material having a cavity (not shown) above the plate 110, which may be a mirror image of substrate 120 and cavity 140. The cavity above plate 110 may have an empty space depth greater than that of cavity 140. The fingers extend over (and part of the busbars may optionally extend over) the cavity (or between the cavities). The cavity 140 may be a hole completely through the substrate 120 (as shown in Section A-A and Section B-B of FIG. 1) or a recess in the substrate 120 (as shown subsequently in FIG. 3A). The cavity 140 may be formed, for example, by selective etching of the substrate 120 before or after the piezoelectric plate 110 and the substrate 120 are attached. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

The portion 115 of the piezoelectric plate suspended over the cavity 140 will be referred to herein as the "diaphragm" (for lack of a better term) due to its physical resemblance to the diaphragm of a microphone. The diaphragm may be continuously and seamlessly connected to the rest of the piezoelectric plate 110 around all, or nearly all, of perimeter of the cavity 140. In this context, "contiguous" means "continuously connected without any intervening item". In some cases, a BOX layer may bond the plate 110 to the substrate 120 around the perimeter.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
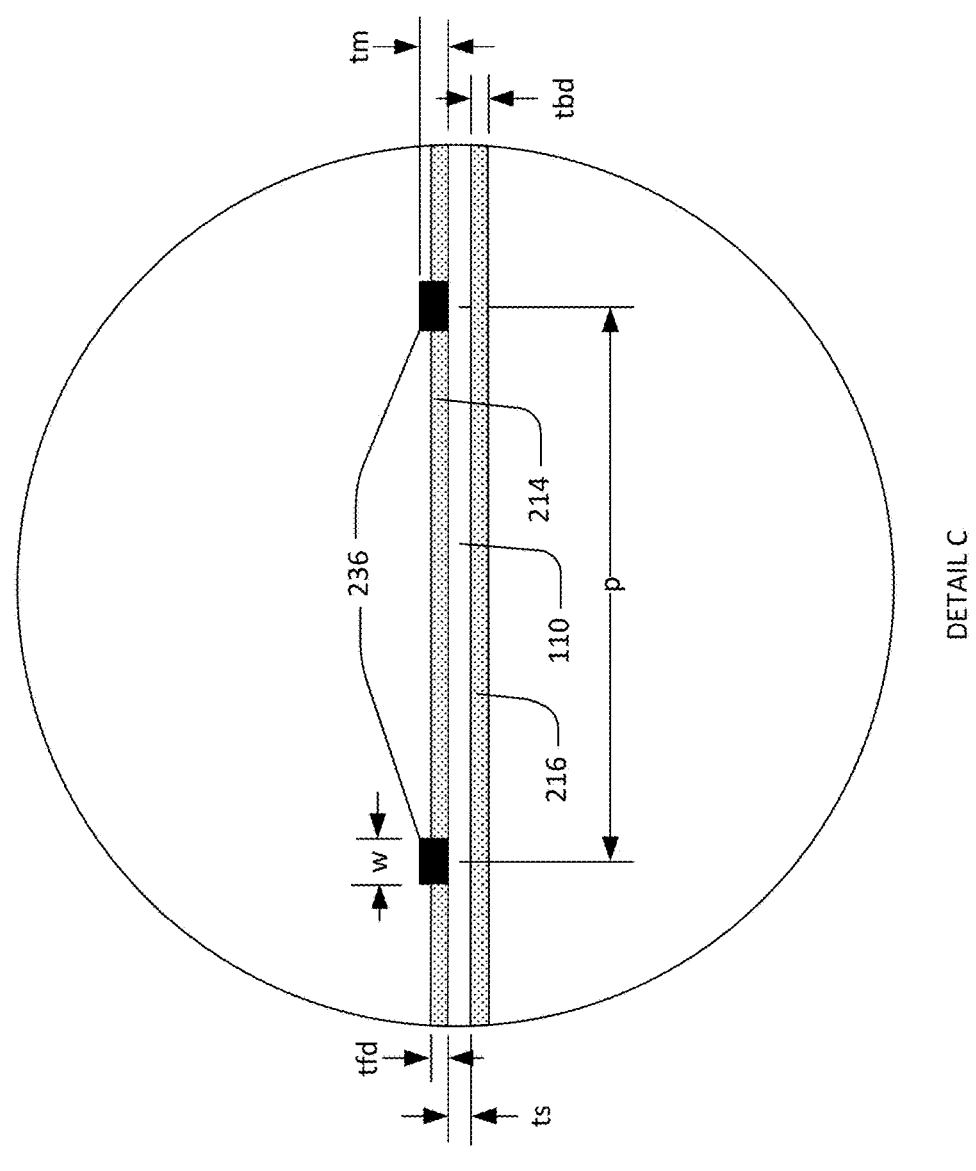
FIG. 2 is an expanded schematic cross-sectional view of a portion of the XBAR of FIG. 1.

FIG. 2 shows a detailed schematic cross-sectional view of the XBAR 100 of FIG. 1. The cross-sectional view may be a portion of the XBAR 100 that includes fingers of the IDT. The piezoelectric plate 110 is a single-crystal layer of piezoelectrical material having a thickness ts. The ts may be, for example, 100 nm to 1500 nm. When used in filters for LTE™ bands from 3.4 GHZ to 6 GHz (e.g., bands 42, 43, 46), the thickness ts may be, for example, 200 nm to 1000 nm.

A front-side dielectric layer 214 may optionally be formed on the front side of the piezoelectric plate 110. The "front side" of the XBAR or plate is, by definition, the surface facing away from the substrate. The front-side dielectric layer 214 has a thickness tfd. The front-side dielectric layer 214 is formed between the IDT fingers 236. Although not shown in FIG. 2, the front side dielectric layer 214 may also be deposited over the IDT fingers 236. A back-side dielectric layer 216 may optionally be formed on the back side of the piezoelectric plate 110. The "back side" of the XBAR or plate is, by definition, the surface facing towards from the substrate. The back-side dielectric layer may be or include the BOX layer. The back-side dielectric layer 216 has a thickness tbd. The front-side and back-side dielectric layers 214, 216 may be a non-piezoelectric dielectric material, such as silicon dioxide or silicon nitride. The tfd and tbd may be, for example, 0 to 500 nm. tfd and tbd are typically less than the thickness ts of the piezoelectric plate. The tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The front side dielectric layer 214 may be formed over the IDTs of some (e.g., selected ones) of the XBAR devices in a filter. The front side dielectric 214 may be formed between and cover the IDT finger of some XBAR devices but not be formed on other XBAR devices. For example, a front side frequency-setting dielectric layer may be formed over the IDTs of shunt resonators to lower the resonance frequencies of the shunt resonators with respect to the resonance frequencies of series resonators, which have thinner or no front side dielectric. Some filters may include two or more different thicknesses of front side dielectric over various resonators. The resonance frequency of the resonators can be set thus "tuning" the resonator, at least in part, by selecting a thicknesses of the front side dielectric.

Further, a passivation layer may be formed over the entire surface of the XBAR device 100 except for contact pads where electric connections are made to circuitry external to the XBAR device. The passivation layer is a thin dielectric layer intended to seal and protect the surfaces of the XBAR device while the XBAR device is incorporated into a package. The front side dielectric layer and/or the passivation layer may be, $SiO_2$, $Si_3N_4$, $Al_2O_3$, some other dielectric material, or a combination of these materials.

The thickness of the passivation layer may be selected to protect the piezoelectric plate and the metal conductors from water and chemical corrosion, particularly for power durability purposes. It may range from 10 to 100 nm. The passivation material may consist of multiple oxide and/or nitride coatings such as SiO2 and Si3N4 material.

The IDT fingers 236 may be one or more layers of aluminum or a substantially aluminum alloy, copper or a substantially copper alloy, beryllium, tungsten, molybdenum, gold, or some other conductive material. Thin (relative to the total thickness of the conductors) layers of other metals, such as chromium nickel, or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3A:
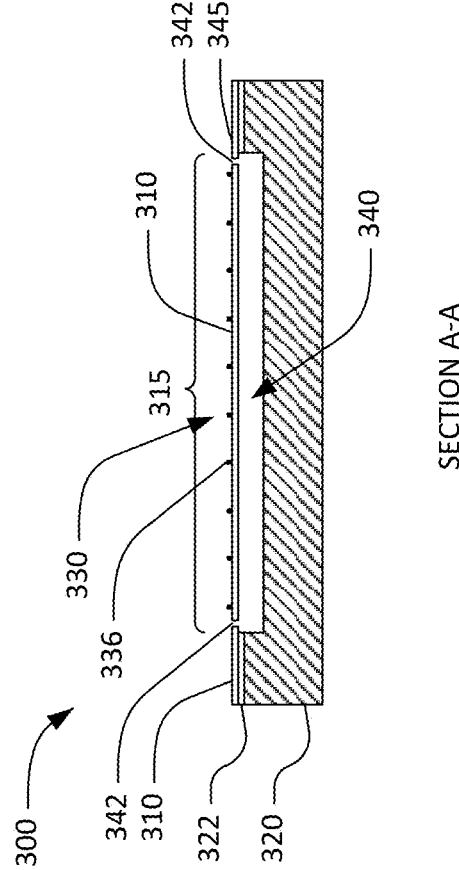
FIG. 3A is an alternative schematic cross-sectional view of an XBAR.

FIG. 3A is an alternative cross-sectional view of XBAR device 300 along the section plane A-A defined in FIG. 1. In FIG. 3A, a piezoelectric plate 310 is attached to a substrate 320. A portion of the piezoelectric plate 310 forms a diaphragm 315 spanning a cavity 340 in the substrate. The cavity 340, does not fully penetrate the substrate 320, and is formed in the substrate under the portion of the piezoelectric plate 310 containing the IDT 330 of a conductor pattern (e.g., first metal or M1 layer) of an XBAR. Fingers, such as finger 336, of IDT 330 are disposed on the diaphragm 315. Interconnection of the IDT (e.g., busbars) 330 to signal and ground paths may be through a second conductor pattern (e.g., M2 metal layer, not shown in FIG. 3) to electrical contacts on a package.

Plate 310, diaphragm 315 and fingers 336 may be plate 110, diaphragm 115 and fingers 136. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings 342 provided in the piezoelectric plate 310. The diaphragm 315 may be contiguous with the rest of the piezoelectric plate 310 around a large portion of a perimeter 345 of the cavity 340. For example, the diaphragm 315 may be contiguous with the rest of the piezoelectric plate 310 around at least 50% of the perimeter of the cavity 340.

One or more intermediate material layers 322 may be attached between plate 310 and substrate 320. An intermediary layer may be or include a bonding layer, a BOX layer, an etch stop layer, a sealing layer, an adhesive layer or layer of other material that is attached or bonded to plate 310 and substrate 320. Layers 322 may be one or more of any of these layers or a combination of these layers.

While the cavity 340 is shown in cross-section, it should be understood that the lateral extent of the cavity is a continuous closed band area of substrate 320 that surrounds and defines the size of the cavity 340 in the direction normal to the plane of the drawing. The lateral (i.e. left-right as shown in the figure) extent of the cavity 340 is defined by the lateral edges substrate 320. The vertical (i.e., down from plate 310 as shown in the figure) extent or depth of the cavity 340 into substrate 320. In this case, the cavity 340 has a side cross-section rectangular, or nearly rectangular, cross section.

The XBAR 300 shown in FIG. 3A will be referred to herein as a "front-side etch" configuration since the cavity 340 is etched from the front side of the substrate 320 (before or after attaching the piezoelectric plate 310). The XBAR 100 of FIG. 1 will be referred to herein as a "back-side etch" configuration since the cavity 140 is etched from the back side of the substrate 120 after attaching the piezoelectric plate 110. The XBAR 300 shows one or more openings 342 in the piezoelectric plate 310 at the left and right sides of the cavity 340. However, in some cases openings 342 in the piezoelectric plate 310 are only at the left or right side of the cavity 340.

In some cases, instead of an intermediate material layer, layer 322 may be a metal layer on the substrate 320 and/or plate 310 such as described for layer 122 being a metal layer on the substrate 120 and/or plate 110.

Figure 3B:
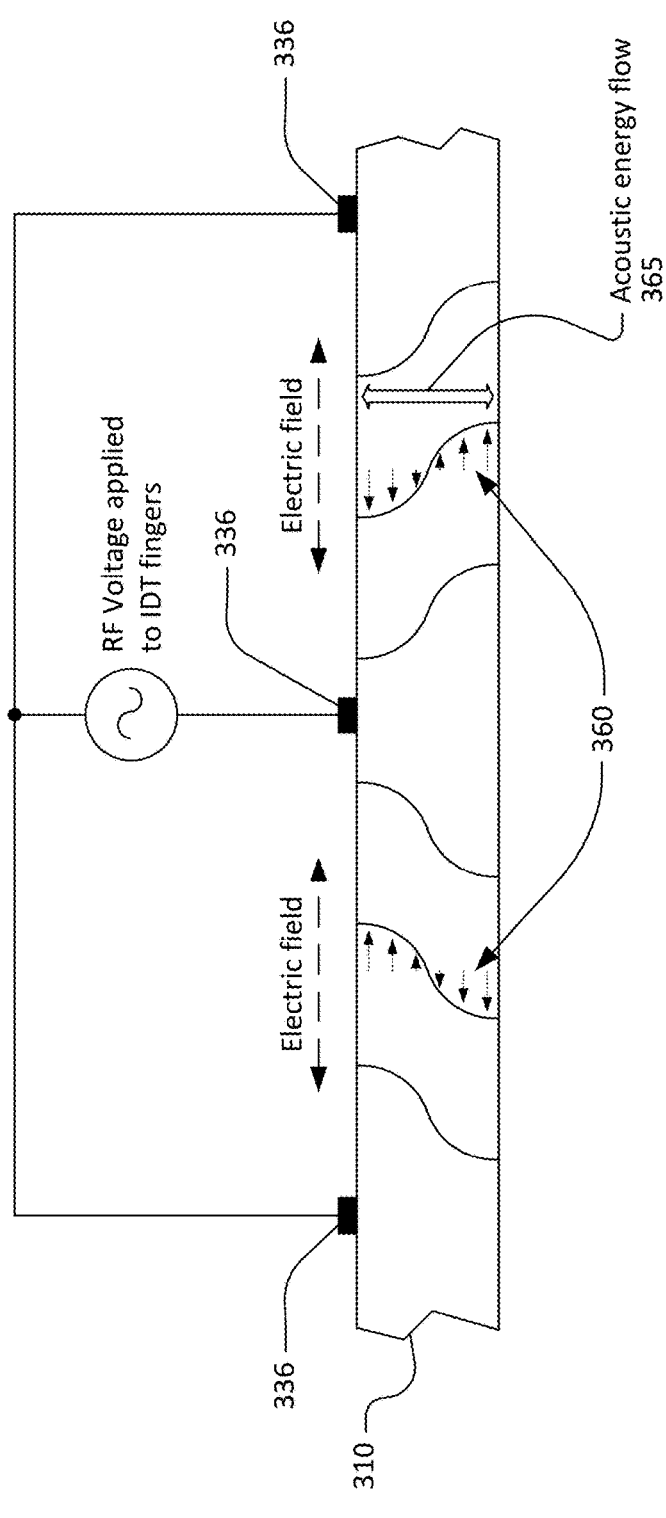
FIG. 3B is a graphical illustration of the primary acoustic mode of interest in an XBAR.

FIG. 3B is a graphical illustration of the primary acoustic mode of interest in an XBAR. FIG. 3B shows a small portion of an XBAR 350 including a piezoelectric plate 310 and three interleaved IDT fingers 336. XBAR 350 may be part of any XBAR herein. An RF voltage is applied to the interleaved fingers 336. This voltage creates a time-varying electric field between the fingers. The direction of the electric field is primarily lateral, or parallel to the surface of the piezoelectric plate 310, as indicated by the arrows labeled "electric field". Due to the high dielectric constant of the piezoelectric plate, the electric field is highly concentrated in the plate relative to the air. The lateral electric field introduces shear deformation, and thus strongly excites a primary shear-mode acoustic mode, in the piezoelectric plate 310. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 350 are represented by the curves 360, with the adjacent small arrows providing a schematic indication of the direction and magnitude of atomic motion. The degree of atomic motion, as well as the thickness of the piezoelectric plate 310, have been greatly exaggerated for ease of visualization. While the atomic motions are predominantly lateral (i.e. horizontal as shown in FIG. 3B), the direction of acoustic energy flow of the excited primary shear acoustic mode is substantially orthogonal to the front and back surface of the piezoelectric plate, as indicated by the arrow 365.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. The piezoelectric coupling for shear wave XBAR resonances can be high (>20%) compared to other acoustic resonators. High piezoelectric coupling enables the design and implementation of microwave and millimeter-wave filters with appreciable bandwidth.

Figure 4:
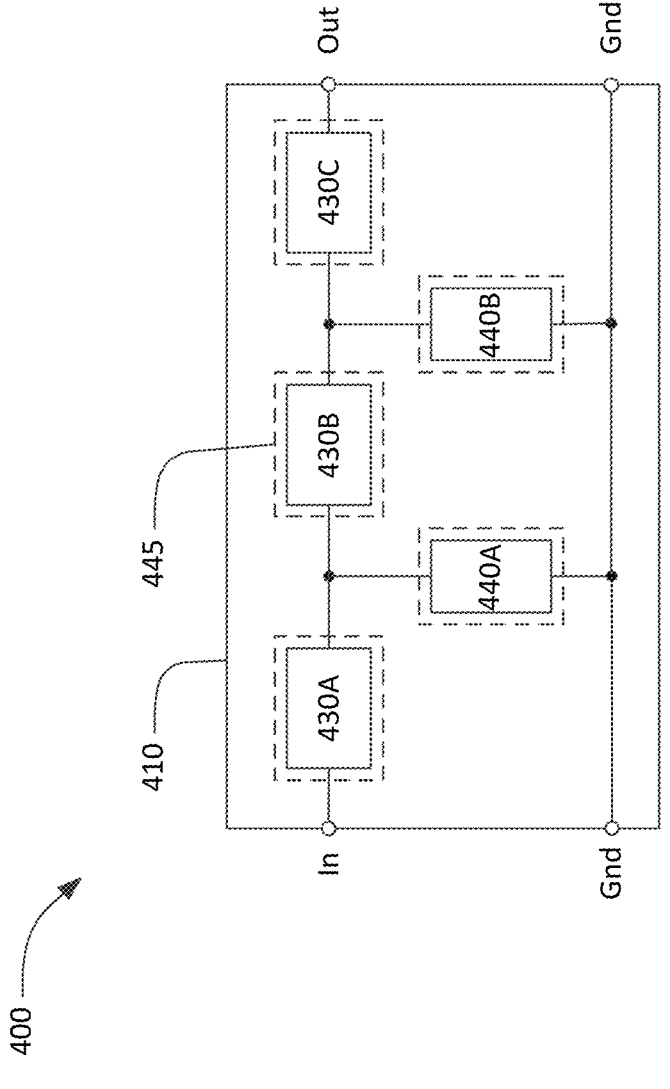
FIG. 4 is a schematic circuit diagram and layout for a high frequency band-pass filter using XBARs.
Figure 5A:
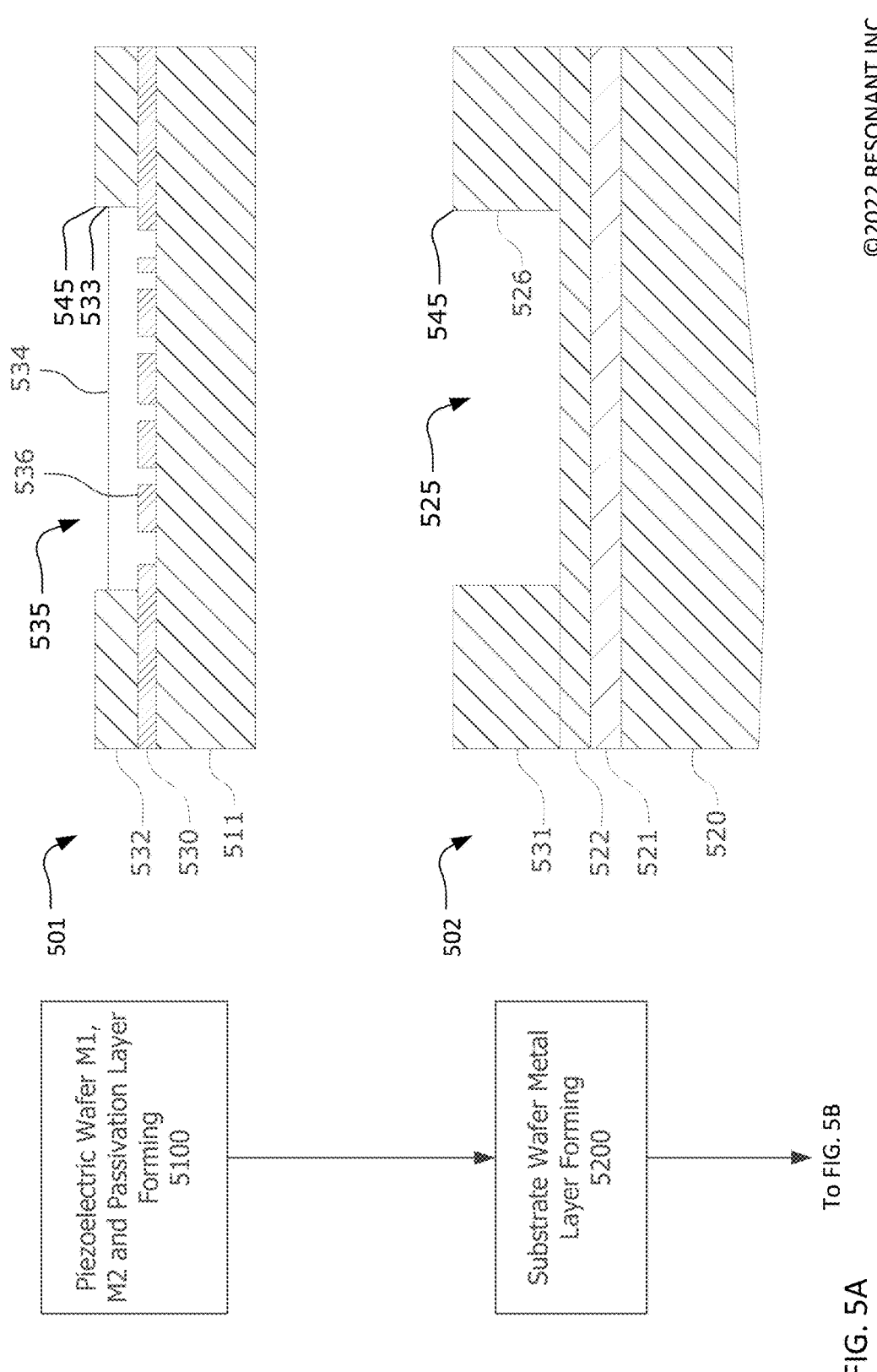
FIGS. 5A, 5B, 5C, 5D and 5E are a flow chart of a process for fabricating a metal cavity XBAR resonator.
Figure 5B:
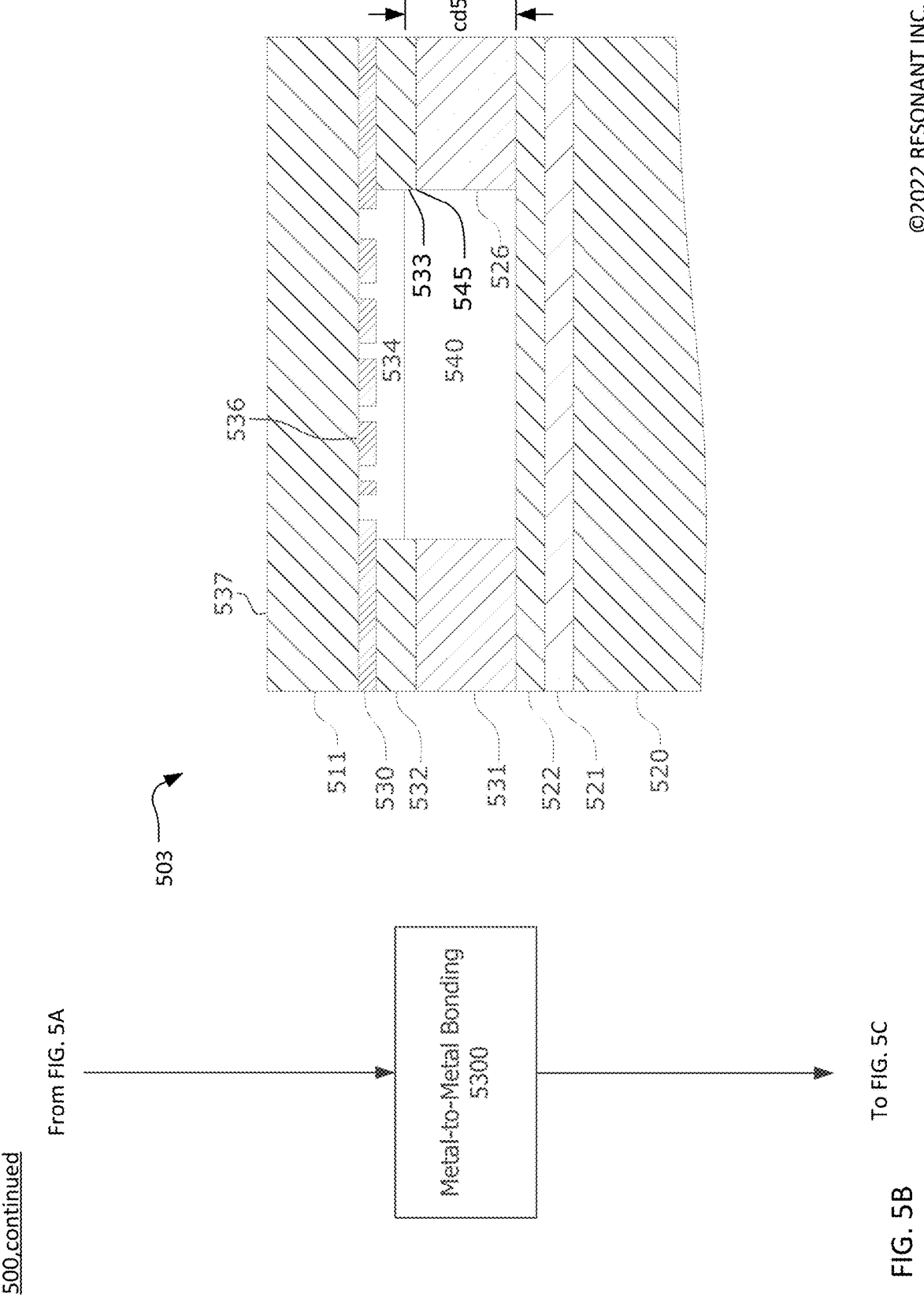
Figure 5C:
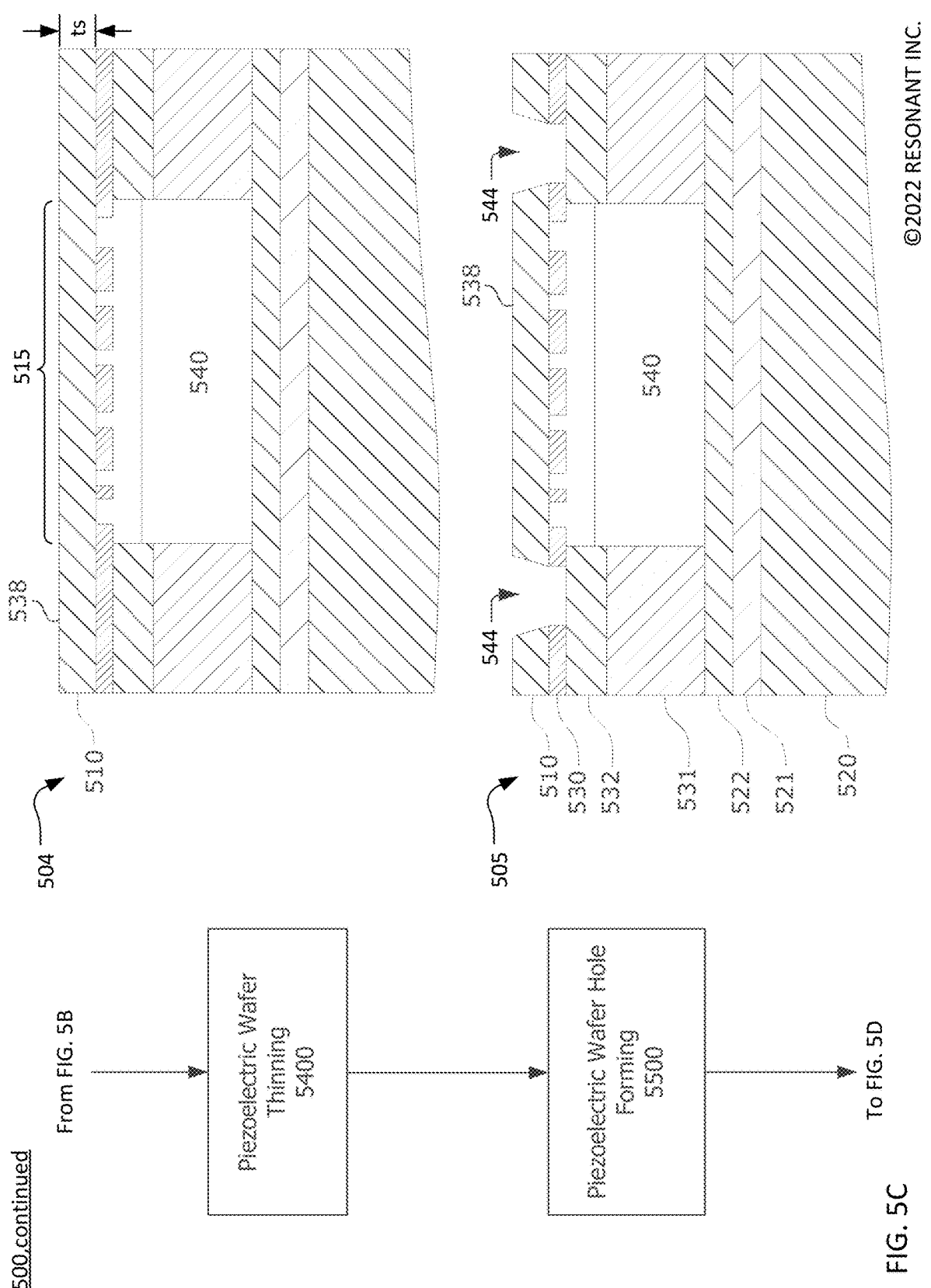
Figure 5D:
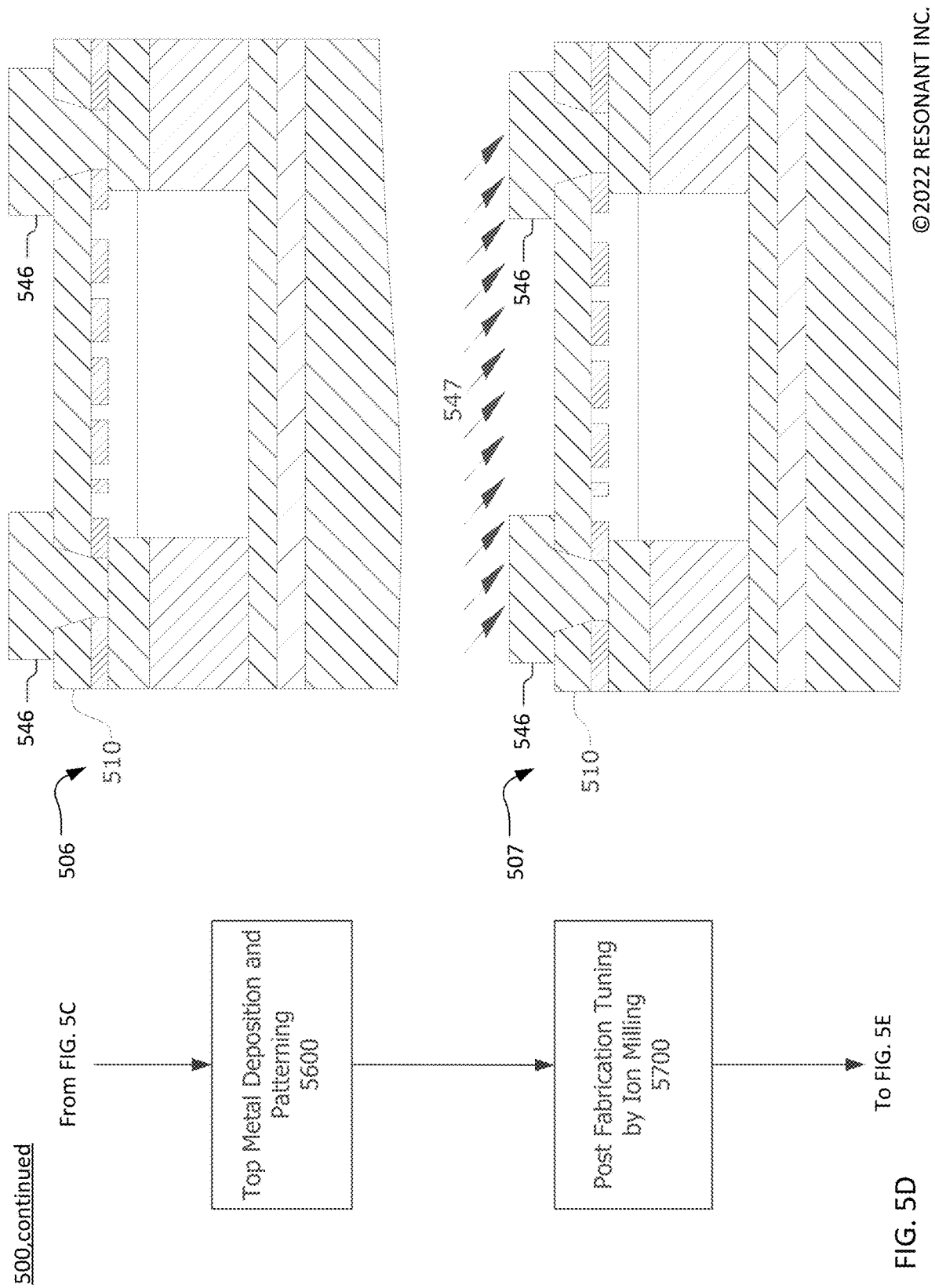
Figure 5E:
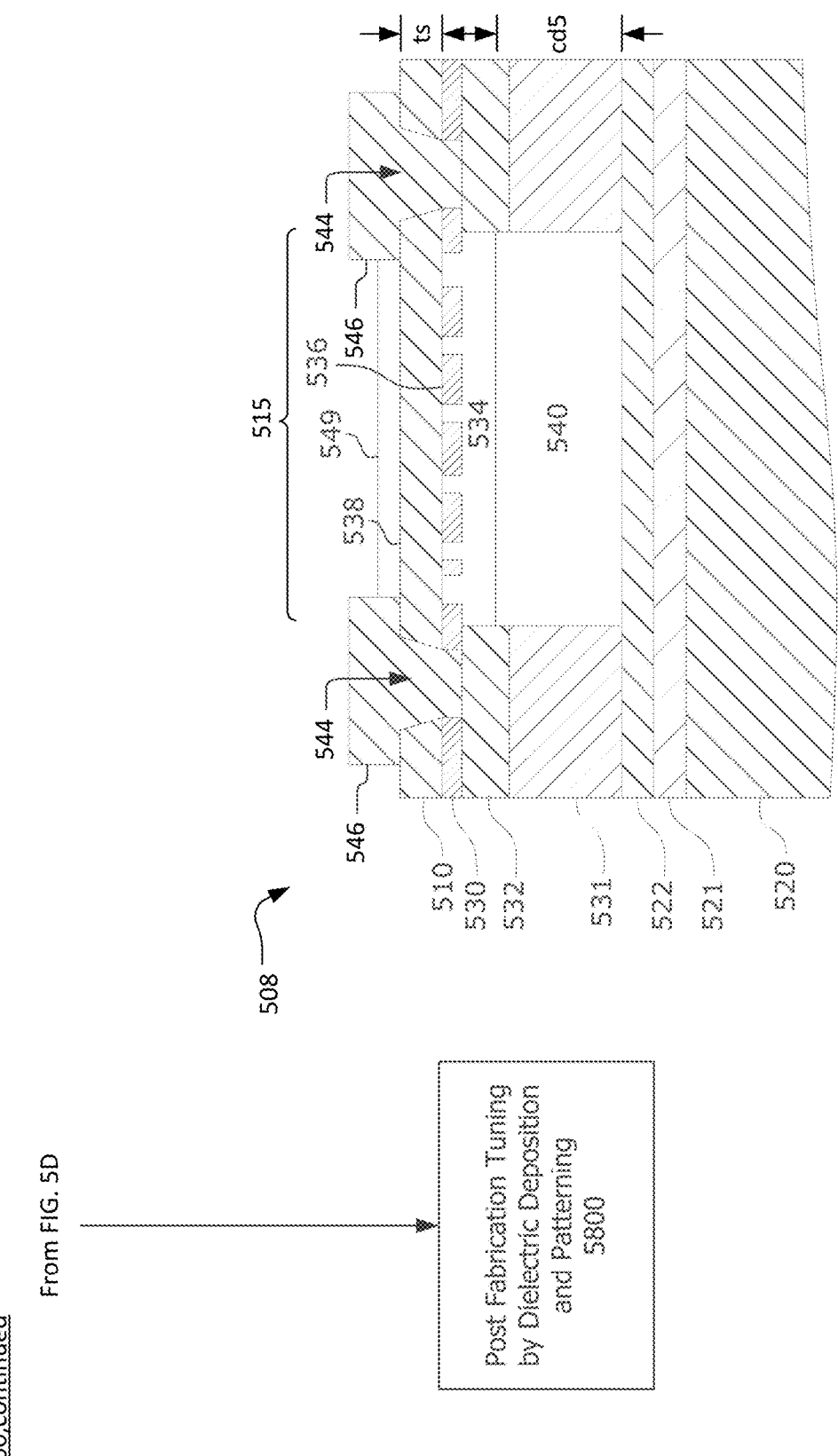
Figure 6A:
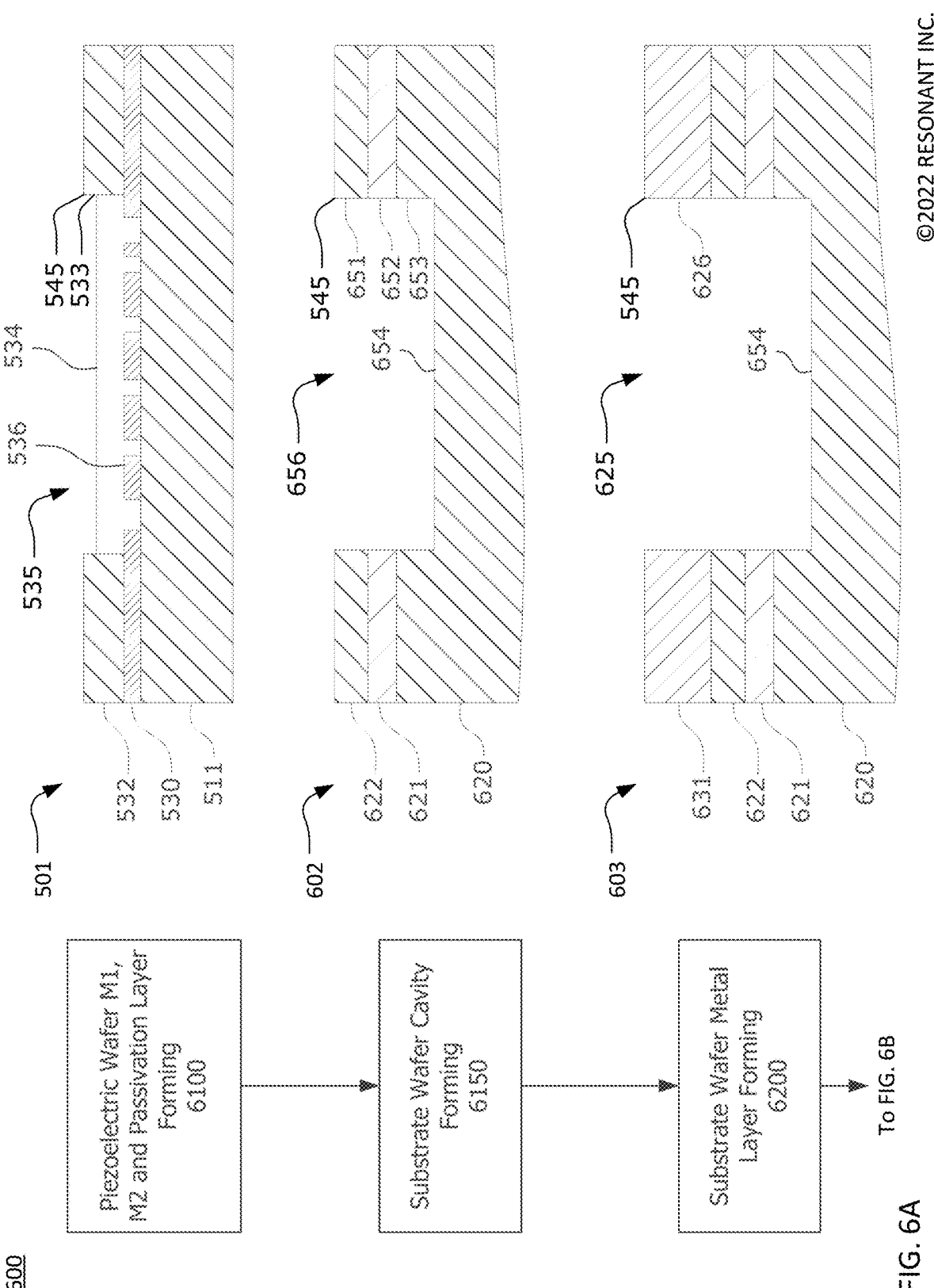
FIGS. 6A, 6B, 6C, 6D and 6E are a flow chart of a process for fabricating a metal cavity XBAR resonator.
Figure 6B:
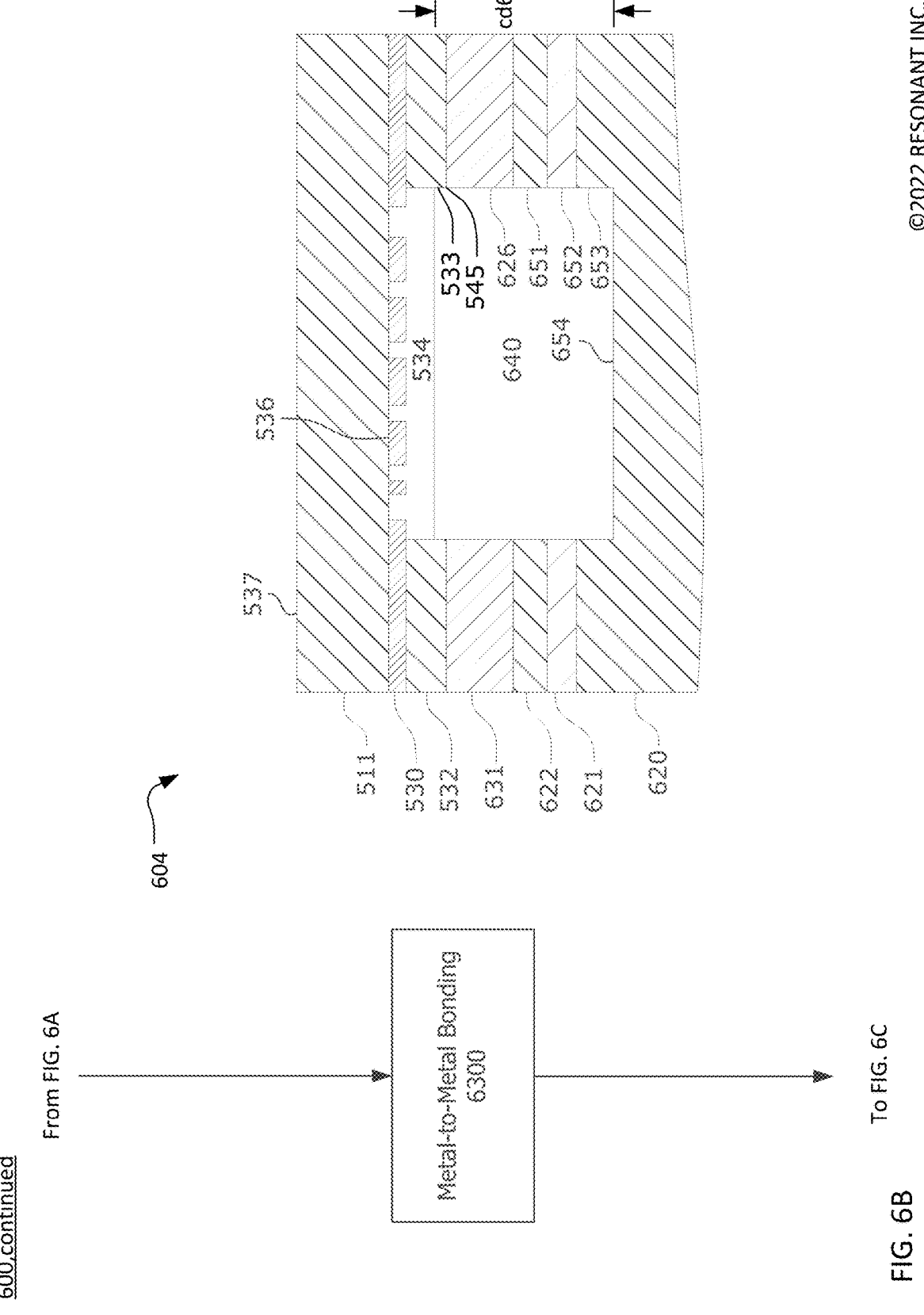
Figure 6C:
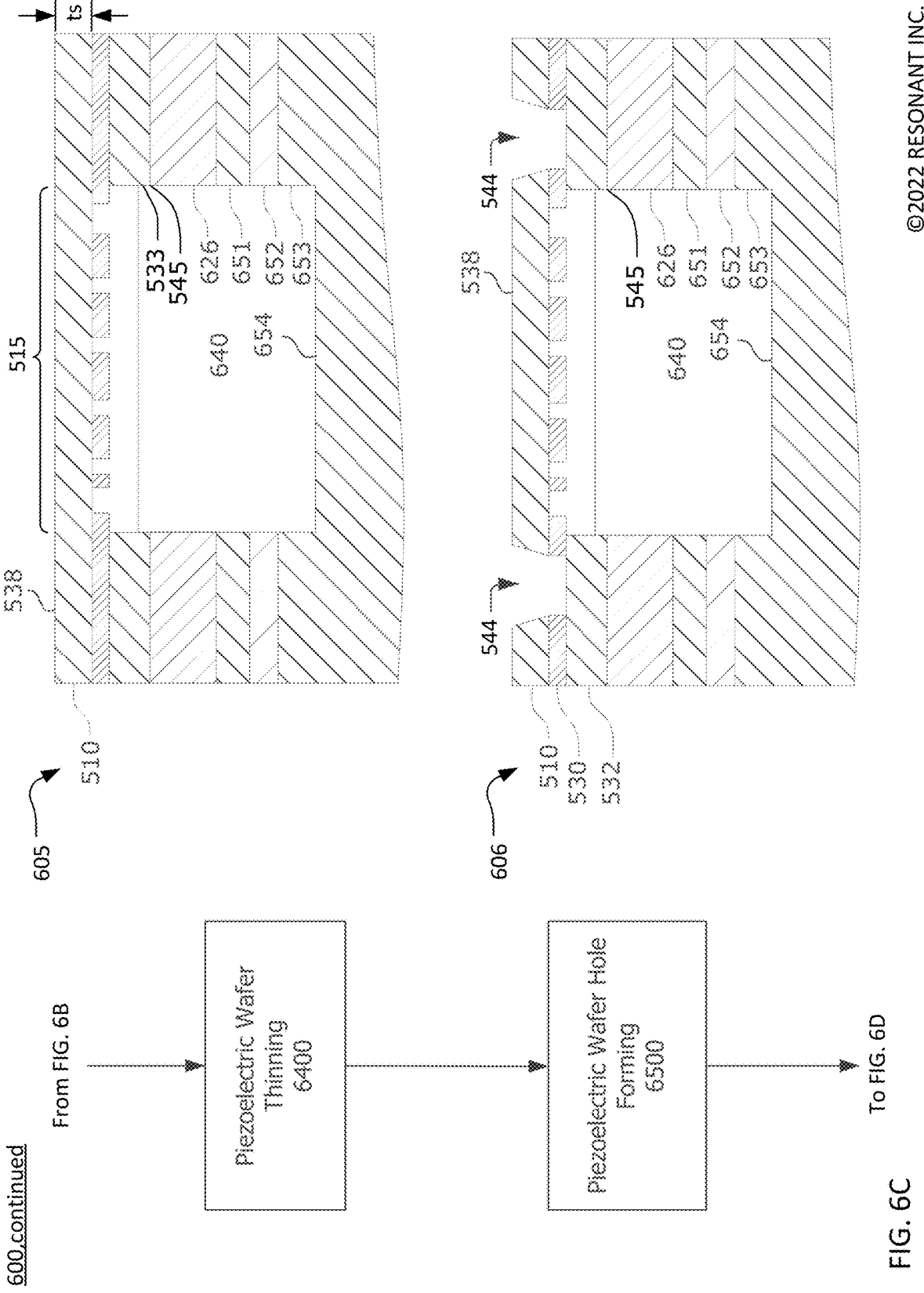
Figure 6D:
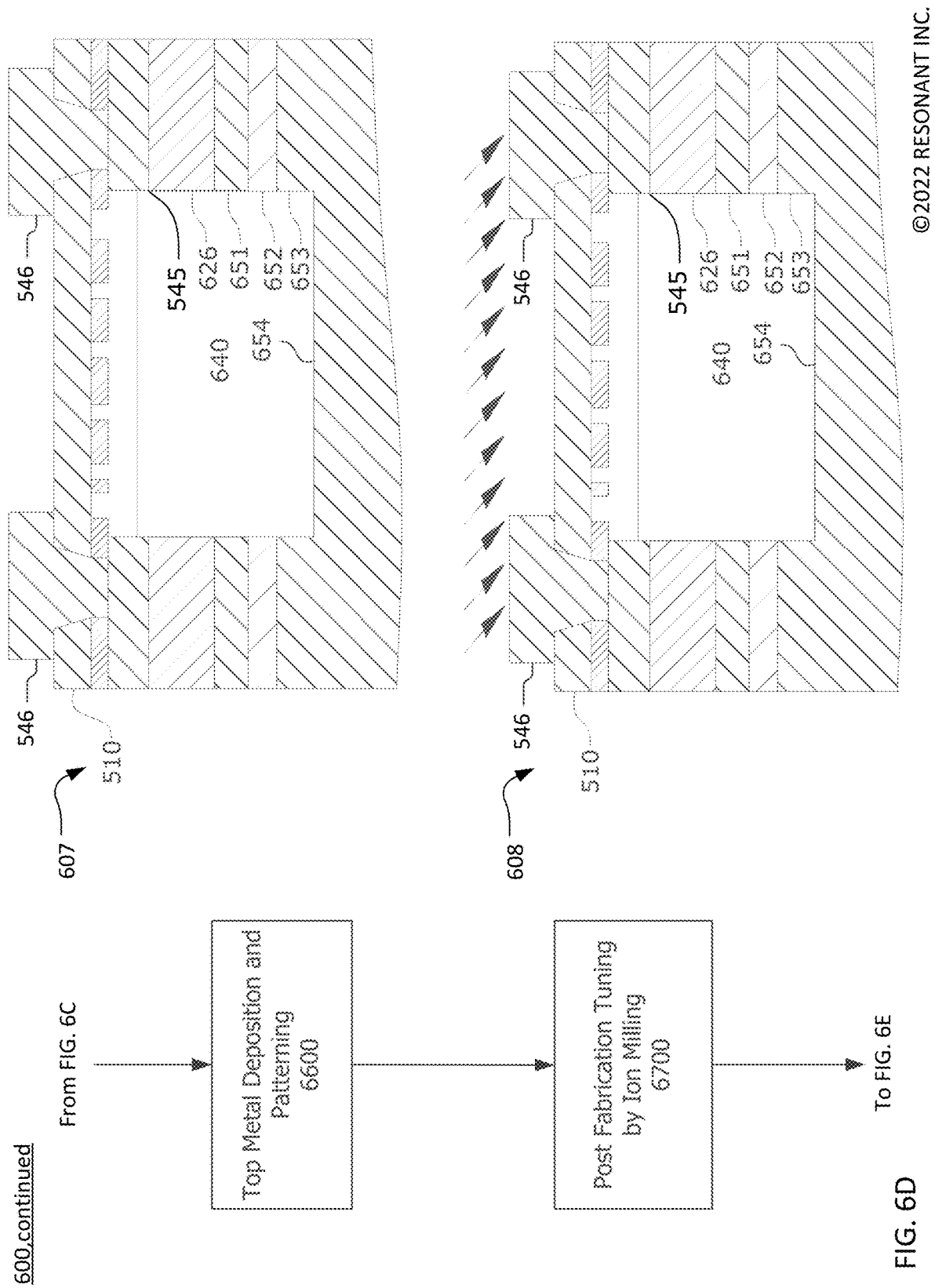
Figure 6E:
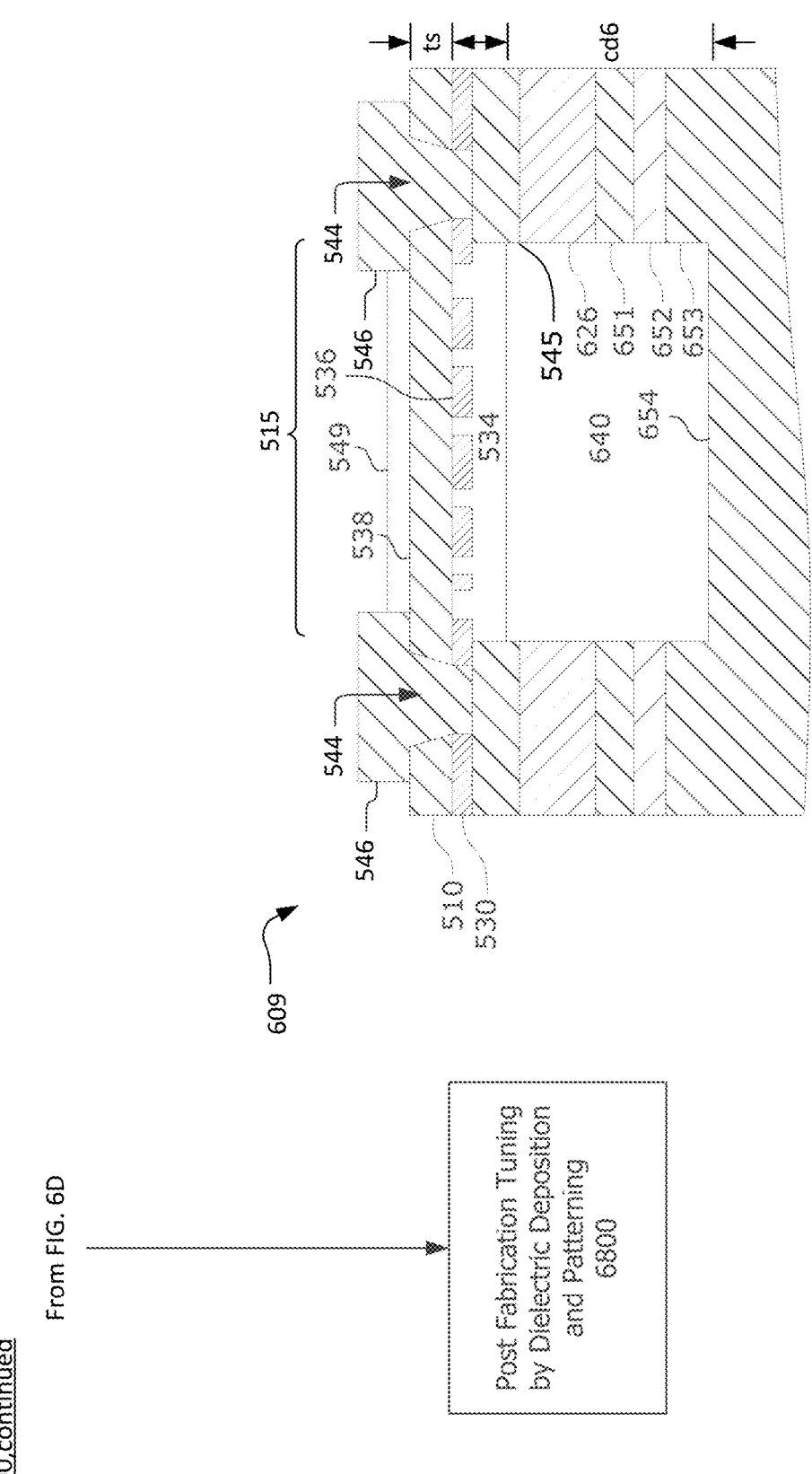
Figure 7A:
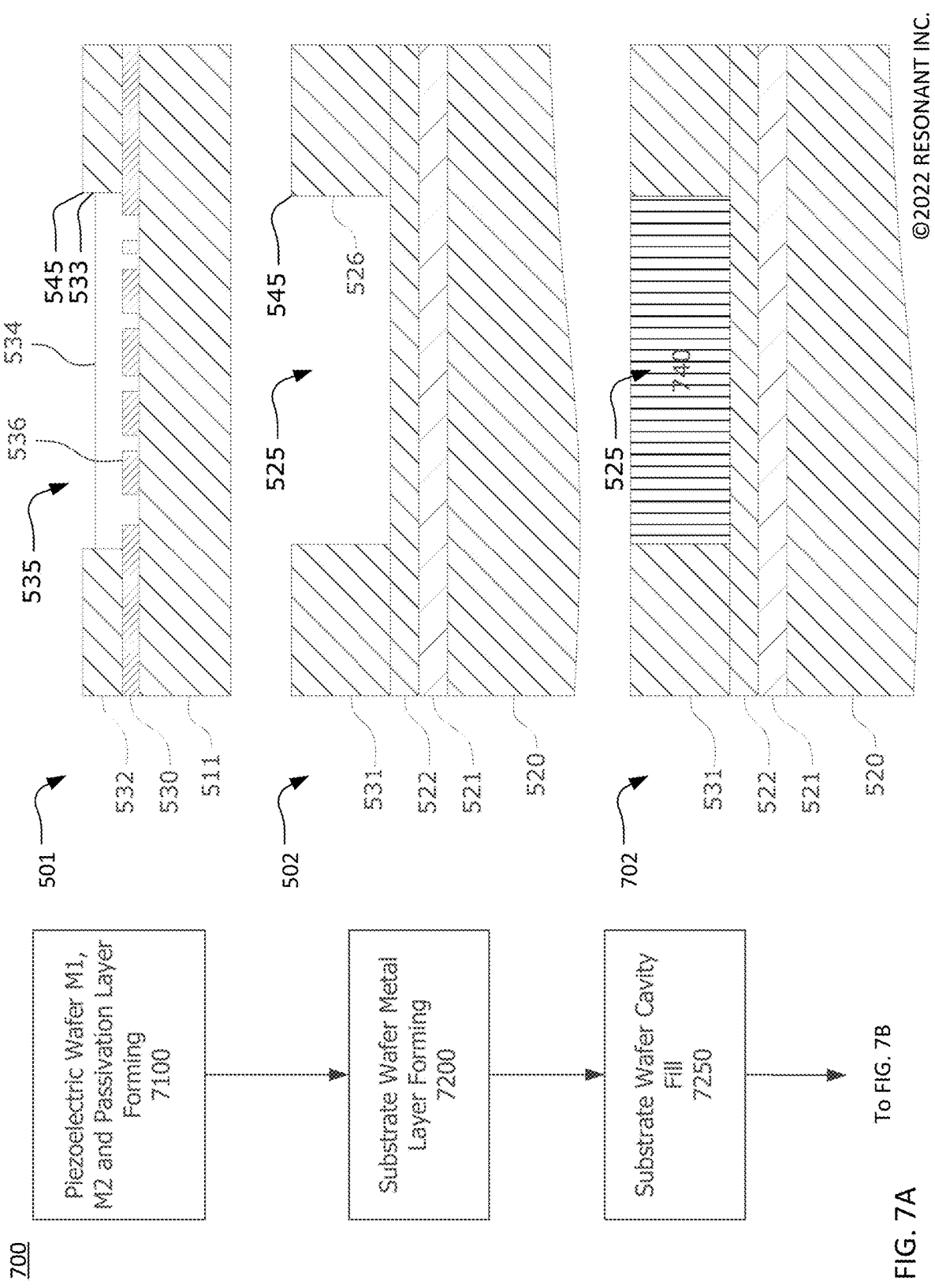
FIGS. 7A, 7B, 7C, 7D, 7E and 7F are a flow chart of a process for fabricating a metal cavity XBAR resonator.
Figure 7B:
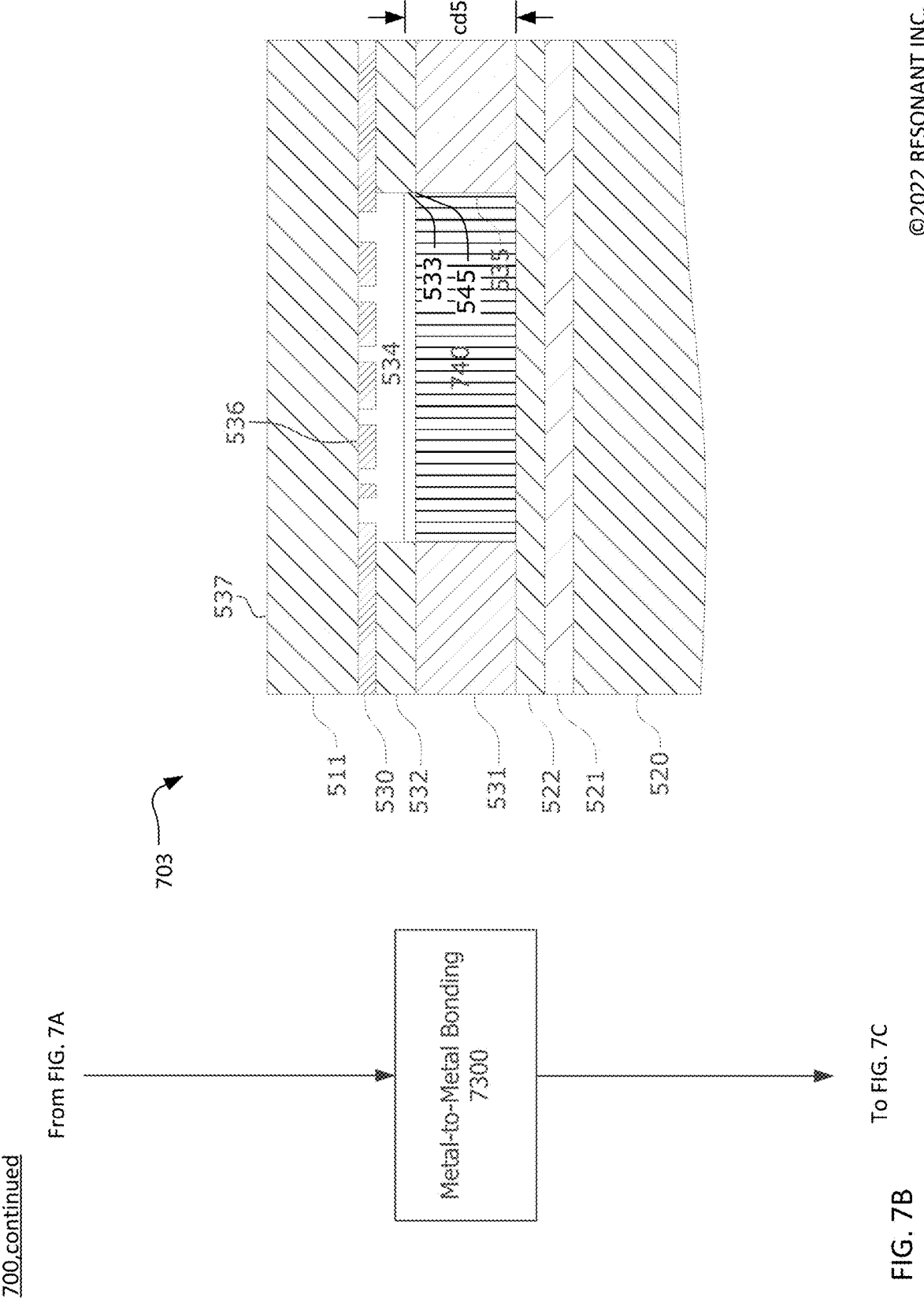
Figure 7C:
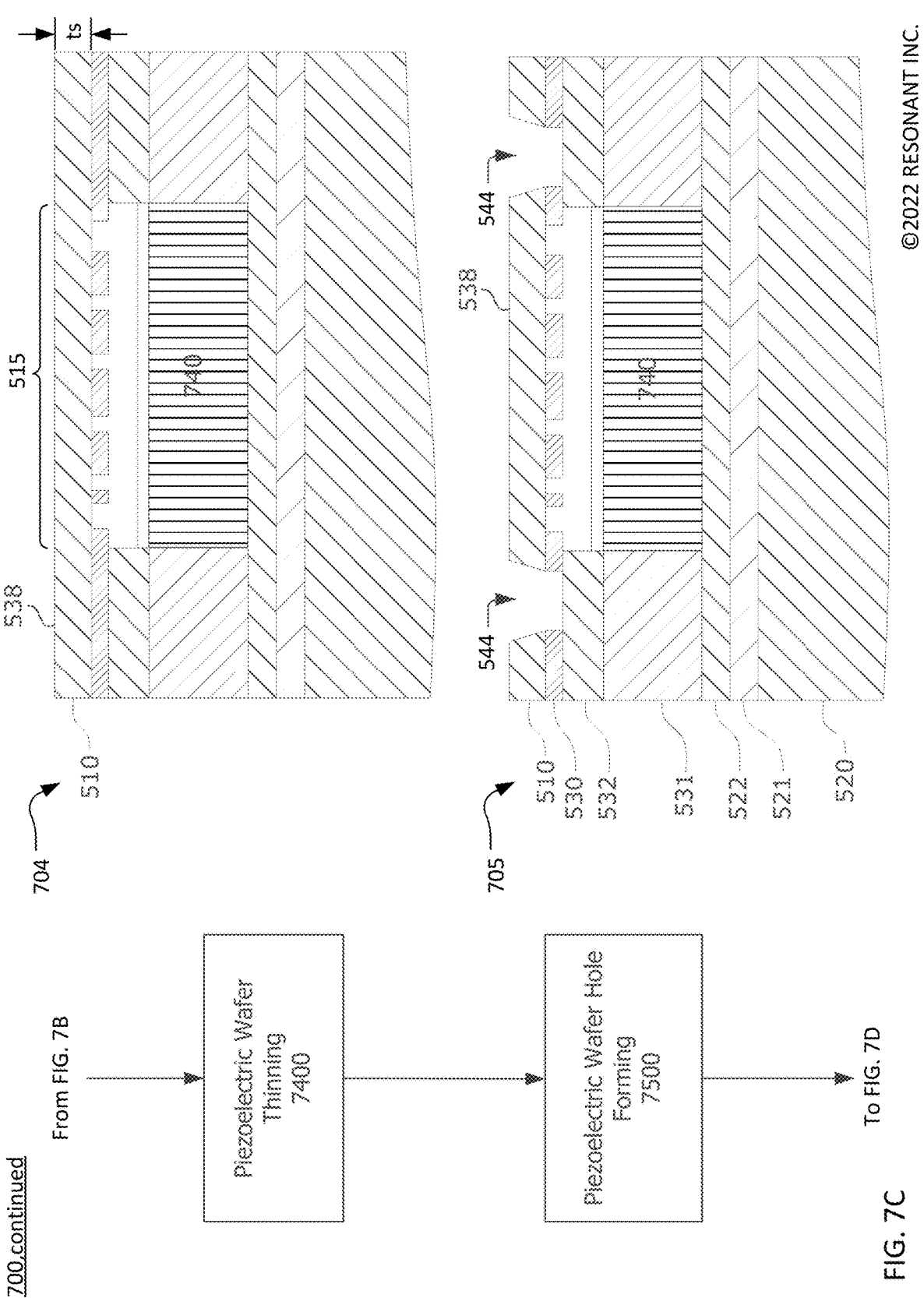
Figure 7D:
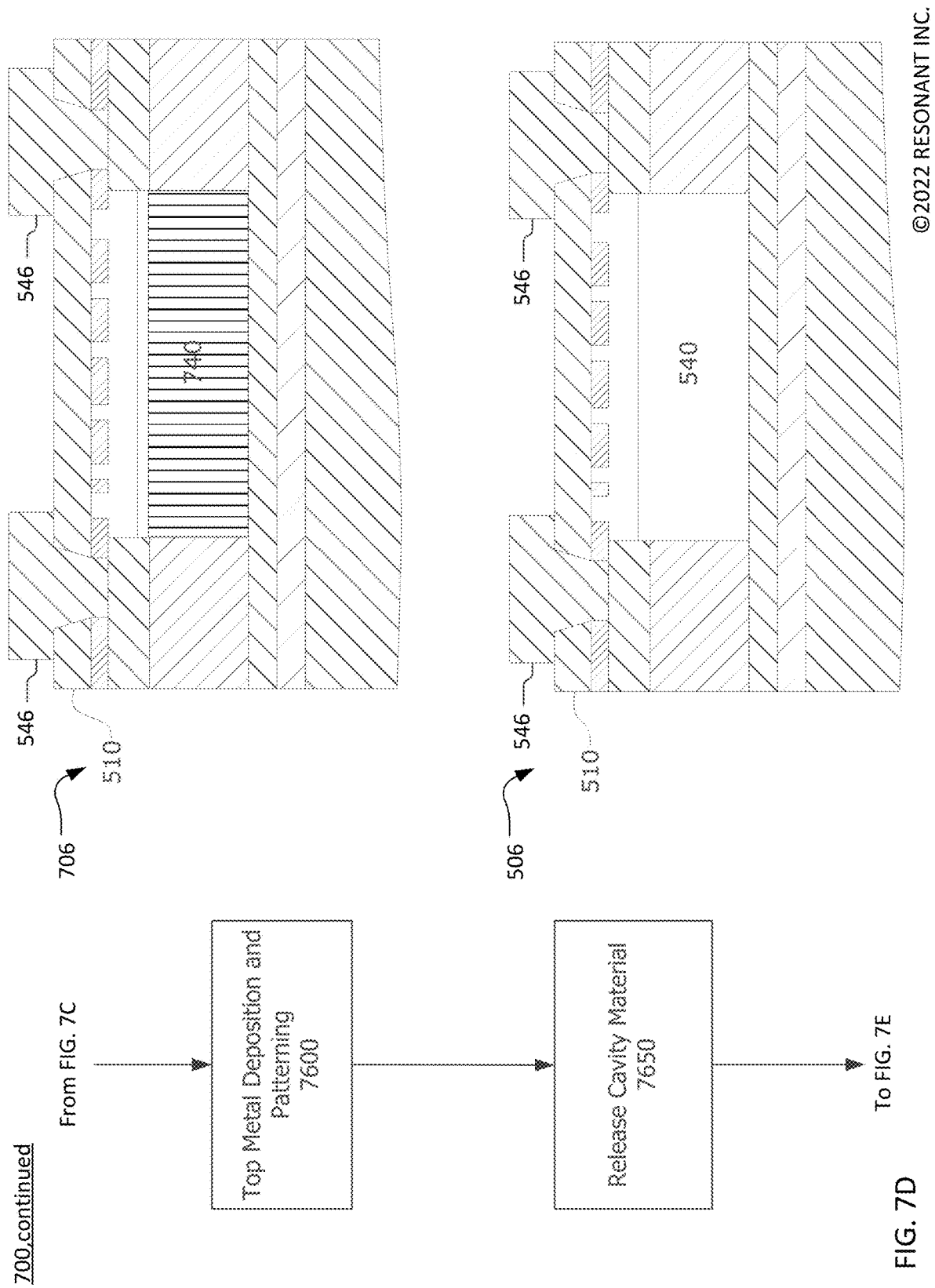
Figure 7E:
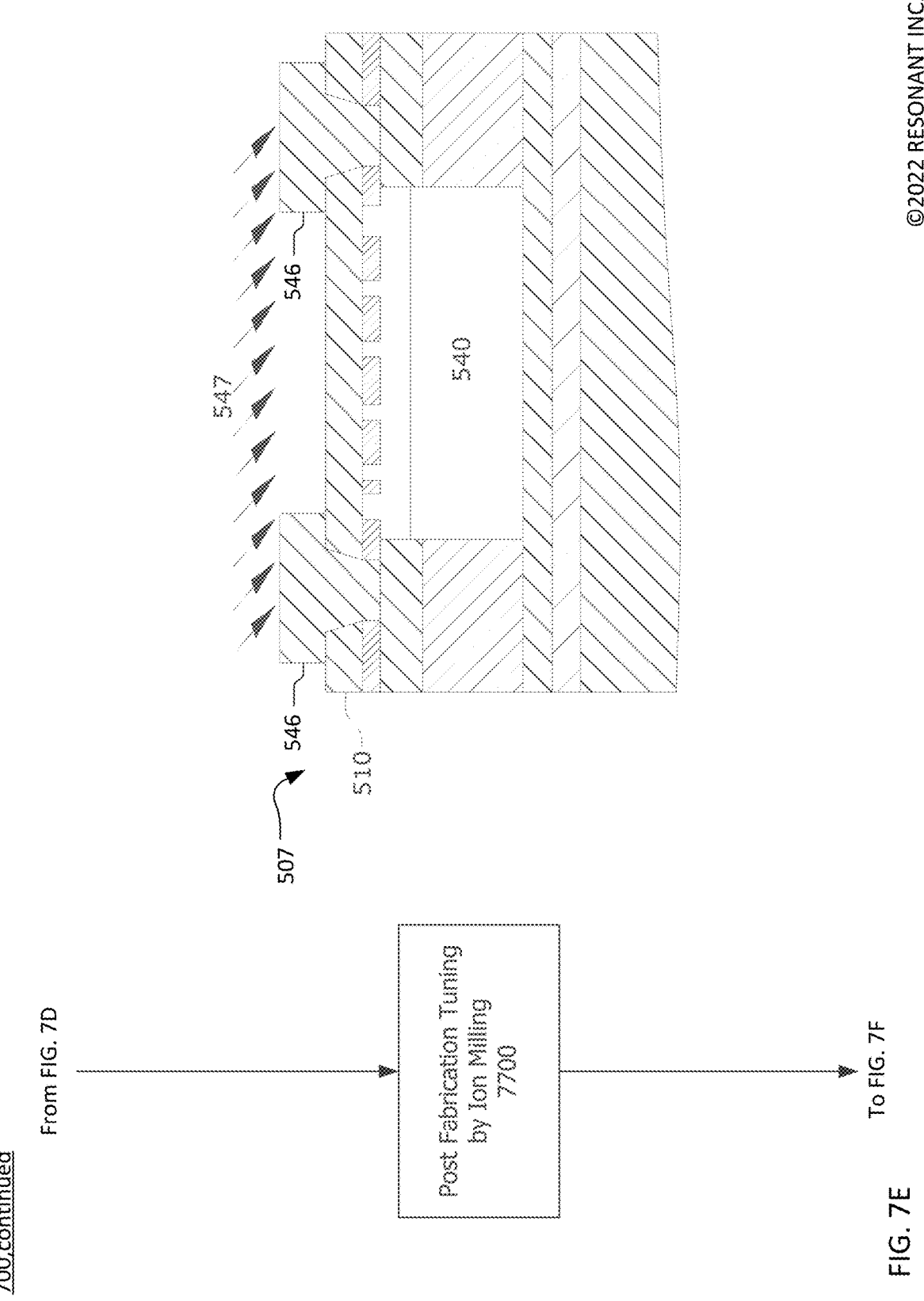
Figure 7F:
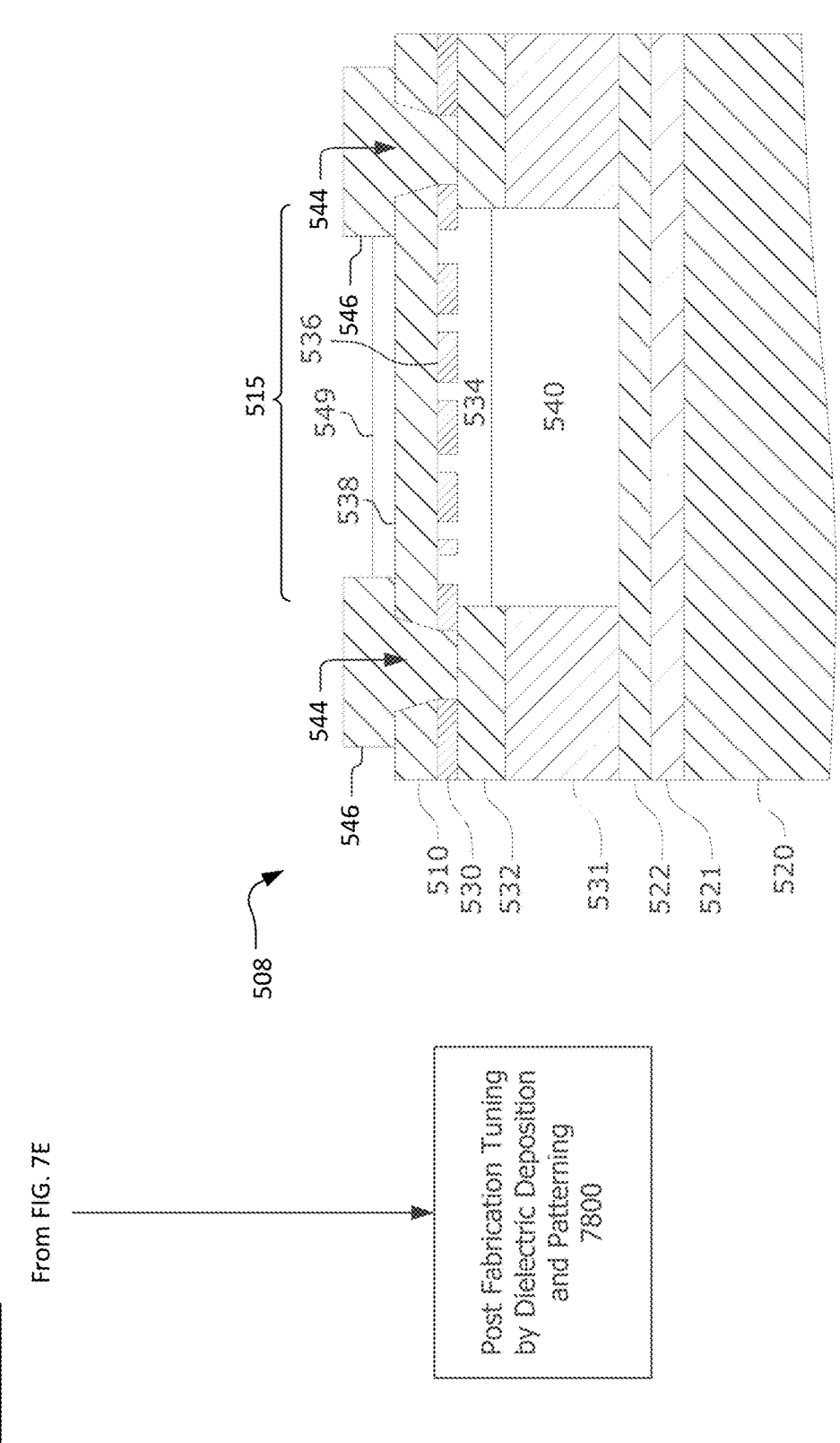

FIG. 4 is a schematic circuit diagram and layout for a high frequency band-pass filter 400 using XBARs. The filter 400 has a conventional ladder filter architecture including three series resonators 430A, 430B, 430C and two shunt resonators 440A, 440B. The three series resonators 430A, 430B, and 430C are connected in series between a first port and a second port. In FIG. 4, the first and second ports are labeled "In" and "Out", respectively. However, the filter 400 is bidirectional and either port and serve as the input or output of the filter. The two shunt resonators 440A, 440B are connected from nodes between the series resonators to ground. All the shunt resonators and series resonators are XBARs on a single die. All or most of the resonators of FIG. 4 are XBAR resonators as noted herein.

The three series resonators 430A, B, C and the two shunt resonators 440A, B of the filter 400 may be formed on a single plate 410 of piezoelectric material bonded to a silicon substrate (not visible). Alternatively, as will be described in further detail, the series resonators and the shunt resonators may be formed on separate plate of piezoelectric material. Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 4, the cavities are illustrated schematically as the dashed rectangles (such as the rectangle 445). In this example, each IDT is disposed over a respective cavity. In other filters, the IDTs of two or more resonators may be disposed over a single cavity.

Description of Methods

FIGS. 5A, 5B, 5C, 5D and 5E are a flow chart of a process 500 for fabricating a metal cavity XBAR resonator. Process 500 may be fabricating an acoustic resonator device having a metal cavity by using a wafer-to-wafer bonding process to form the metal cavity.

The process 500 may be the forming of or may be included in the forming of resonator 100 or 300. The flow chart of FIG. 5 includes only major process steps. Various conventional process steps (e.g. surface preparation, chemical mechanical processing (CMP), cleaning, inspection, deposition, photolithography, baking, annealing, monitoring, testing, etc.) may be performed before, between, after, and during the steps shown in FIG. 5. The process 500 starts at step 5100 and ends at step 5800 with a completed XBAR RF resonator 508.

At 5100, piezoelectric (e.g., LN) wafer metal 1 (M1) layer, metal 2 (M2) layer and passivation layer processing are performed to form layers 530, 532 and 534, respectively, on piezoelectric wafer 511. First, an M1 conductor layer having interleaved interdigital transducer (IDT) 530 is formed on a back surface of the plate 511. Then, and a M2 conductor layer 532 is formed on parts of the M1 conductor layer 530. Passivation layer 534 is then formed on exposed parts of the wafer 511 and IDT 530 to form device 501.

Forming each of layers 530, 532 and 534 may include a deposition and etching process, such as a blanket deposition of a layer of the material of the layer, a masking of the blanket layer, then and etching of the layer through the mask to form each of layers 530, 532 and 534. Forming each of layers 530, 532 and 534 may include depositing and patterning a photoresist layer, a blanket deposition of the material of the layer, and removal of the photoresist to lift off the overlying material. Step 5100 may include or be part of forming layers 130 or 330.

The M1 and M2 layers may each be one or more layers of aluminum or a substantially aluminum alloy, copper or a substantially copper alloy, beryllium, tungsten, molybdenum, gold, chromium, titanium, nickel, or some other conductive material such as noted for layers 130 and 330. They may each be copper, aluminum or a combination thereof.

Step 5100 may include forming a conductor pattern including IDT fingers 536 on a piezoelectric wafer 511. It may include forming the IDT fingers 536 on a back surface of the plate 511 that will be facing and within the cavity 525 or 540 (see below). Step 5100 may include forming a dielectric layer 534 over the interleaved IDT fingers 536 and the back surface of the portion of the piezoelectric wafer 511 that spans the cavity. Layer 534 may be front-side dielectric layer 214 and/or a passivation layer. Forming M2 may be forming a second metal layer on the conductor pattern with IDT 530 and the piezoelectric wafer 511. Step 5100 may include forming a metal layer 532 on wafer 511, the metal layer having a cavity 535. It may include forming the metal layer 532 and then forming the cavity 535 in the metal layer 532.

Step 5100 may include forming a cavity 535 in the M2 second metal layer 532 having walls 533 forming a perimeter 545 of a cavity 535 with or as part of a depth and having an area for a cavity 540 of the resonator.

At 5200, substrate (e.g., Si) wafer metal deposition and patterning are performed to form layers 521, 522 and 531 on substrate wafer 520 (e.g., a silicon wafer). First, a trap rich semiconductor layer 521 is formed on a front surface of the wafer 520. Then, and an oxide layer 522 is formed on the layer 521. Then metal cavity wall layer 531 is formed on parts of the oxide layer 522 to form device 502. Layer 531 has walls 526 forming a perimeter 545 of a cavity 525 with or as part of a depth and having an area for a cavity 540 of the resonator.

Forming each of layers 521, 522 and 531 may include a deposition step, such as a blanket deposition of a layer of the material of the layer. They layer may then be polished. Layer 531 may then be masked and etched through the mask to form cavity 252. In other cases, layer 531 may then be masked and a lift-off of the mask performed to form cavity 252. The lift off mask may be formed on the area of the cavity while the tech mask is formed over areas except the cavity. Step 530 may include or be part of forming a package for the resonator.

The trap rich layer 521 may be a layer on or as part of the (e.g., silicon) wafer 520. The trap-rich layer 521 has an abundance of traps that capture free carriers and reduce carrier lifetime to an extent that the conductivity of the trap-rich layer 521 approaches zero. It may be amorphous silicon or polycrystalline silicon.

A trap-region layer 521 may be formed, for example, on a silicon wafer 520 by depositing a layer of trap-rich material such as amorphous silicon or polysilicon (polycrystalline silicon). When the trap-rich layer is polysilicon, the average grain size of the polysilicon should be substantially smaller than the minimum spacing between IDT fingers 536. The thickness of the trap rich region formed on or within a high resistivity silicon substrate should be greater than the thickness of an inversion layer that may form in the absence of the trap-rich layer. The trap-rich layer may be formed in some other manner.

Layer 522 may be a bonding layer as noted for layer 122 and/or 322. It may be an oxide layer such as SiO2. Layer 522 may be an etch stop for etching cavity 525 in layer 531.

The layer 531 may be one or more layers of aluminum or a substantially aluminum alloy, copper or a substantially copper alloy, beryllium, tungsten, molybdenum, gold, chromium, titanium, nickel, or some other conductive material such as noted for layers 130 and 330. The layer 531 may be gold, copper, aluminum or a combination thereof.

Step 5200 may include forming a metal layer 531 on a substrate 520, the metal layer having a cavity 525. It may include forming the metal layer 531 and then forming the cavity 525 in the metal layer 531.

At step 5300 a wafer-to-wafer, metal-to-metal bond is performed to bond layer 532 to layer 531. The metal-to-metal bond may be a wafer-to-wafer (W2 W) metal-to-metal bond. The wafer-to-wafer metal-to-metal bonding technique can utilized a thermocompression or diffusion bonding technique, where two metals of the two metals are brought into atomic contact by applying force and heat simultaneously. At the contact interface, the atoms of the two metals migrate from one crystal lattice of one of the two metals to the other one of the two metals based on crystal lattice vibration of both of the two metals. This diffusion of atoms enables the interface of the two metals to stick together.

At 5300, wafer bonding is performed to bond device 501 to device 502, thus forming device 503. The bonding at 5300 may be a metal-to-metal heat bond, annealed bond, ultrasonic bond, or another metal-to-metal bond. Step 5300 may include flipping device 501 or 502, aligning the cavities 535 and 525 and bonding the layers 532 and 531 to form cavity 540 of an XBAR resonator with cavity depth cd5 between layer 534 and the top of layer 522. Cavity 540 is the combination of cavity 535 and cavity 525. Cavity 540 may function the same as cavity 140 or 340. Step 5300 may include flip-chip bonding device 501 and the metal layer 532 onto the device 502 and metal layer 531. Device 503 may be part of device 508.

Layers 532 and 531 are electrically connected to each other as well as to external circuitry such as through solder bumps, or other connections (not shown) to be part of electrically conducting signal or ground paths, wires, traces and/or the like. They may be touching and bonded by wafer-to-wafer and/or metal-to-metal bonding.

Step 5300 may include bonding the piezoelectric wafer 511 to the metal layer 531 using a metal-to-metal bond such that the IDT fingers 536 are disposed over the cavity 540. Step 5300 may include bonding the metal layer 532 to the metal layer 531 using a metal-to-metal bond is between those metal layers. Step 5300 may be bonding layer 532 to layer 531 using a metal-to-metal bond such that cavity 535 is aligned with cavity 525 and such that the IDT fingers 536 are disposed over the cavity 540. Being aligned may be the two cavities 525 and 535 having a same area over each other and/or having a same perimeter 545 from a top view. The aggregate depth of the two cavities is the depth of cavity 540 and a depth desired for a cavity above or below the IDT of an XBAR.

At 5400, the piezoelectric wafer 511 is thinned. Thinning may include piezoelectric (e.g., LN) wafer back-grinding, CMP and/or ion trimming of the front surface 537 of the piezoelectric wafer 511 to form the front surface 538 and piezoelectric plate 510. At 550, wafer 511 may be a thinned by having an original thickness of the wafer reduced to a desired thickness is of plate 510. Plate 510 may be plate 110 or 310. Ion trimming may include ion beam trimming, which is a special ion beam milling process, where a focused beam of Ar+ ions scans across the wafer 511, physically removing away the surface material through an ablation process. The thickness of wafer 511 removed can be controlled by the ion beam current, gun voltage, angle of incidence, dwell time, and scan rate.

Thinning at 5400 may include thinning the piezoelectric wafer 511 to form a piezoelectric plate 510 having a portion of the piezoelectric plate forming a diaphragm 515 that spans the cavity.

At 5500, holes 544 are formed in the piezoelectric plate 510 and optionally in the conductor layer having IDT 530 to form device 505. Forming the holes 544 may include piezoelectric (e.g., LN) wafer ion trimming and/or ion milling of the front surface 538 of the plate 510 to form plate 512. At 550, holes may be formed at locations or areas where through waver vias (TWVs) and contacts are to be formed from the front surface 538 of the plate 512 to the conductor layer having IDT 530 and/or to the M2 metal layer 532.

Ion milling may include a physical etching technique whereby the ions of an inert gas (typically Ar) are accelerated from a wide beam ion source into the surface 538 of a plate 510 in vacuum in order to remove material to some desired depth or underlayer, such as to the conductor layer having IDT 530 and/or to the M2 metal layer 532.

Holes 544 may be formed by masking plate 510, forming a pattern on the mask and etching, ion trimming and/or ion milling the plate 510 (and optionally conductor layer having IDT 530) through the openings in the mask. Forming holes at 5500 may include forming holes through the plate that are not used to etch the cavity 540, since the cavity is already formed at 5300.

At 5600, top metal deposition and patterning are performed on device 505 to form contacts 546 and device 506. Step 5600 may include the deposition of a blanket layer of metal over the front surface 538 of plate 510 that fills holes 544 and extends above the front surface 538 of plate 510. The layer may then be patterned by a mask, and the patterned layer etched to form contacts 546. The blanket layer may be polished before patterning. The plate 510 may be used as an etch stop for the etch.

Filling the holes 544 includes the metal (e.g., and contacts 546) extending to and contacting the conductor layer having IDT 530 and optionally to the M2 layer 532.

The contacts 546 may be one or more layers of aluminum or a substantially aluminum alloy, copper or a substantially copper alloy, beryllium, tungsten, molybdenum, gold, chromium, titanium, nickel, or some other conductive material such as noted for layers 130 and 330. The contacts 546 may be copper, aluminum or a combination thereof.

Forming contacts at 5600 may include filling the holes 544 with conductor to form contacts 546 extending from a front side of the plate 510 to the conductor pattern of IDT 530 and/or to IDT 530.

The deposition and patterning at 5600 may be a larger structure processing than that of steps 5100-5500 and 5700, such as by using a lower resolution patterning and etch than those other steps.

At 5700, post-fabrication tuning is performed by ion milling 547 of device 506 to form device 507. The ion milling may be a thinning of surface 538 to adjust the resonance and antiresonance frequency of the device 506 to be that of device 507 to the desired resonance and antiresonance frequencies, which is dependent on the thickness, ts, of the piezoelectric layer. The thickness, ts, of the piezoelectric layer may be changed at 5700 to tune those frequencies to desired frequencies.

At 5800, post-fabrication tuning is performed using dielectric layer 549 (e.g., SiO2) deposition and patterning of device 507 to form device 508. Forming layer 549 may be forming a layer of dielectric on surface 538 between contacts 546. Step 5800 may include blanket layer deposition of a layer of dielectric material, patterning a mast over the blanket layer and etching through the patterned mask to form layer 549. Etching may use surface 538 as a vertical etch stop. The etching mayo use contacts 546 as an etch stop, such as horizontally and/or vertically. Layer 549 may be back-side dielectric layer 216. The thickness, of dielectric layer 549 may be selected at 5800 to tune the frequencies to desired frequencies.

Depositing and/or etching layer 549 may be forming a thickness of layer 549 to adjust the resonance and antiresonance frequency of the device 507 to be that of device 508 which are a desired resonance and antiresonance frequency for the resonator. By depositing layer 549, the resonance and antiresonance frequency of the device 507 is effectively lowered than that of device 508. A subsequent etching process on layer 549 will then raise the resonance and antiresonance frequency of the device 507 to be that of device 508 which are a desired resonance and antiresonance frequency for the resonator.

The deposition and patterning at 5800 may be a larger structure processing than that of steps 5100-5500 and 5700, such as by using a lower resolution patterning and etch than those other steps.

Device 508 has a piezoelectric plate 510, a portion of the piezoelectric plate spanning a cavity 540 in a metal layer 531 over, on or of a substrate 520. An interdigital transducer 530 is on a surface of the piezoelectric plate 510, interleaved fingers of the IDT 530 on the portion (e.g., membrane 515) of the piezoelectric plate that spans the cavity 540. A metal-to-metal bond between metal layers 531 and 532 bonds the piezoelectric plate 510 to the metal layer 531 such that the IDT fingers 536 are disposed over the cavity 540. Dielectric layer 534 is over the interleaved fingers and a surface of the portion of the piezoelectric plate 510 that spans the cavity 540. The IDT 530 and the fingers 536 are on a back surface of the plate facing and within the cavity 540. Openings or holes 544 are formed through the plate 510; and conductor material is formed through the openings and forms 546 contact (e.g., contacts through vias and/or forming contact pads) from the front surface of the plate 538 to the IDT 530.

The interleaved fingers 536 of the IDT are disposed on the diaphragm 515 such that the piezoelectric plate 510 and the IDT 530 are configured such that a radio frequency signal applied to the IDT 530 excites a shear primary acoustic mode within the diaphragm 515.

FIGS. 6A, 6B, 6C, 6D and 6E are a flow chart of a process 600 for fabricating a metal cavity XBAR resonator. Process 600 may be fabricating an acoustic resonator device having a metal cavity by using a wafer-to-wafer (by D-Process) bonding process to form the metal cavity. The process 600 may be the forming of or may be included in the forming of resonator 100 or 300. The process 600 includes only major process steps. Various conventional process steps (e.g. surface preparation, chemical mechanical processing (CMP), cleaning, inspection, deposition, photolithography, baking, annealing, monitoring, testing, etc.) may be performed before, between, after, and during the steps shown in FIG. 6. The process 600 starts at step 6100 and ends at step 6800 with a completed XBAR RF resonator 609. The flow chart of FIG. 6 may be similar to that of FIG. 5 with the exception of the changes at steps 6150 and 6200.

At 6100, piezoelectric (e.g., LN) wafer M1 layer, M2 layer and passivation layer processing are performed similar to at 5100 to form device 501.

At 6150, a substrate wafer cavity etch is performed to form cavity 656 through oxide layer 622, through trap rich semiconductor layer 621 and into substrate wafer 620 to form device 602. Step 6150 includes forming layers 522 and 521 on substrate wafer 520 (e.g., a silicon wafer) as noted at step 5200. Then step 6150 includes forming a cavity 656 into the oxide layer 522, trap rich semiconductor layer 521 and substrate wafer 520 to form the oxide layer 622, trap rich semiconductor layer 621 and substrate wafer 620.

Layers 622, 621 and 620 each have walls 651, 652 and 653, respectively, forming a perimeter 545 of a cavity 656 with or as part of a depth and having an area for a cavity 640 of the resonator.

Step 6150 may include a masking layer 522, patterning the mask and then etching through openings in the pattern to form cavity 656. The etch may be a timed etch to form the cavity 656 a desired depth into substrate 620 so that cavity 625 has a desired depth dc6 to cavity bottom 654 for cavity 640 as described below. Step 6150 may include forming a cavity 656 that extends into the substrate 620.

At 6200, substrate (e.g., Si) wafer metal deposition and patterning are performed to form layer 631 on and cavity 625 into substrate wafer 620 (e.g., a silicon wafer). Here, metal cavity wall layer 631 is formed on parts of the oxide layer 622 to form device 603. At 6220, layer 631 may be formed on all the exposed top surface of layer 622. Layer 631 has walls 626 forming a perimeter 545 of a cavity 525 with or as part of a depth and having an area for a cavity 640 of the resonator.

At 6200, instead of metal layer 531, device 603-609 have a metal layer 631 similar to layer 531 but thinner in height. The benefit of a thinner metal layer 631 as compared to layer 531 may be cost savings due to using less metal and access to other more cost-effective metal deposition techniques; better bonding due to a more equal thickness of layer 532 and thinner 631; and/or better performance due to less metal in the cavity such as causing less capacitance in the resonator. In this case, larger depth cavity 656 as compared to cavity 525 may be used to ensure a depth of cavity 640 sufficient to avoid the plate 510 from contacting the cavity bottom 654, which would cause the resonator to become damaged or to operate improperly such as causing it not to provide the proper resonant frequency.

Cavity 625 also has layers 622, 621 and 620; and walls 651, 652 and 653, forming a perimeter 545 of the cavity 656.

Forming layer 631 and the material of layer 631 at step 6200 may be similar to forming that layer and the material of layer 531 at step 5200, except with a thinner layer 631 than 531.

Step 6200 may include forming a metal layer 631 on a substrate 620 having a cavity at a location for a cavity or a resonator, the metal layer having a cavity 625. It may include forming the metal layer 631 and then forming the cavity 625 in the metal layer 631 and extending into the substrate wafer 620.

At step 6300 a wafer-to-wafer, metal-to-metal bond is performed to bond layer 532 to layer 631. The metal-to-metal bond may be a W2W metal-to-metal bond, such as a wafer-to-wafer, metal-to-metal bond as noted at step 5300.

At 6300, wafer bonding is performed to bond device 501 to device 603, thus forming device 604. The bonding at 6300 is similar to that at 5300 and device 604 is similar to device 503 except device 604 has cavity 640 with depth cd6 extending through layer 622, through layer 621 and into substrate 620 to bottom surfaced 654. At 6300, the bond may provide a cavity 640 that is a deeper cavity than a flow process of 500. This deeper cavity by process 600 will reduce the risk of the diaphragm 515 or plate membrane touching the bottom of the cavity during high power use or high temperature operation of the resonator. More air in the cavity due to increased depth or thickness of the cavity provides better thermal conduction than a shorter depth or thickness, which may occur in process 500. More distance in the cavity between the XBAR device and the Si substrate also improves performance, such as improving obtaining a higher frequency performance or resonant frequency of the resonator 608 as compared to resonator 508.

Cavity 640 is the combination of cavity 535 and cavity 625. Cavity 640 may function the same as cavity 140 or 340. Step 6300 may include flip-chip bonding device 501 and the metal layer 532 onto the device 603 and metal layer 631. Device 604 may be part of device 609.

At 6400, the piezoelectric wafer 511 is thinned as noted for step 5400. At 6400, plate 511 is thinned to be plate 510 and to form device 605. At 6400, plate 511 of device 604 is thinned to form plate 510, thus forming device 605.

At 6500, holes 544 are formed in the piezoelectric plate 510 similar to forming holes 544 at step 5500. At 6500, holes 544 are formed in the piezoelectric plate 510 to form device 606.

At 6600, top metal deposition and patterning are performed on device 606 similar to forming contacts 546 step 5600. At 6600, top metal deposition and patterning are performed on device 606 to form contacts 546 and device 506.

At 6700, post-fabrication tuning is performed by ion milling 547 of device 607 similar to tuning at step 5700. At 6700, ion milling of contacts 546 and/or surface 538 may be performed on device 607 to form device 608.

At 6800, post-fabrication tuning is performed using dielectric layer 549 (e.g., SiO2) deposition and patterning of device 608 to form device 609. Forming layer 549 may be forming a layer of dielectric on surface 538 between contacts 546 at noted at stop 5800.

FIGS. 7A, 7B, 7C, 7D, 7E and 7F are a flow chart of a process 700 for fabricating a metal cavity XBAR resonator. Process 700 may be fabricating an acoustic resonator device having a metal cavity by using a wafer-to-wafer (by D-Process) bonding process to form the metal cavity. The process 700 may be the forming of or may be included in the forming of resonator 100 or 300. The process 700 includes only major process steps. Various conventional process steps (e.g. surface preparation, chemical mechanical processing (CMP), cleaning, inspection, deposition, photolithography, baking, annealing, monitoring, testing, etc.) may be performed before, between, after, and during the steps shown in FIG. 6. The process 700 starts at step 7100 and ends at step 7950 with a completed XBAR RF resonator 508. The flow chart of FIG. 7 may be similar to that of FIG. 5 with the exception of the changes at steps 7250 through 7700.

At 7100, piezoelectric (e.g., LN) wafer M1 layer, M2 layer and passivation layer processing are performed similar to at 5100 to form device 501.

At 7200, substrate (e.g., Si) wafer metal deposition and patterning are performed to form layers 521, 522 and 531 on substrate wafer 520 (e.g., a silicon wafer) similar to at 5200 to form device 502.

At 7250 cavity 525 is filled with a layer of phosphosilicate glass (PSG) 740 to form a sacrificial material in cavity 525 for later etching and to form device 702. The PSG layer 740 provides mechanical support for wafer 511 during thinning to form plate 510 so that the wafer does not bend, buckle or break during that formation. The sacrificial material also provides protection against particulates, contaminants, and processing liquids from entering the cavity. Other sacrificial material include, SiO2 and ZnO.

Forming layer 740 may include a deposition step, such as a blanket deposition of a layer of the PSG material. That layer may then be polished to a top surface of layer 531. Polishing may be performed by grinding, CMP and/or another appropriate process.

At step 7300 a wafer-to-wafer, metal-to-metal bond is performed to bond layer 532 to layer 531. The metal-to-metal bond may be a W2 W, metal-to-metal bond as noted at step 5300.

Step 7300 may include wafer bonding to bond device 501 to device 703, thus forming device 703. The bonding at 7300 is similar to that at 5300 and device 703 is similar to device 503 except device 703 has layer 740. Cavity space 740 is the combination of cavity 535 and cavity 525 having material 740. Material 740 may extend to the surface of layer 534 or may not extend to that surface. Step 7300 may include flip-chip bonding device 501 and the metal layer 532 onto the device 702 and metal layer 531.

At 7400, the piezoelectric wafer 511 is thinned as noted for step 5400. At 7400, plate 511 is thinned to be plate 510 and to form device 704. At 7400, plate 511 of device 703 is thinned to form plate 510, thus forming device 704.

At 7500, holes 544 are formed in the piezoelectric plate 510 similar to forming holes 544 at step 5500. At 7500, holes 544 are formed in the piezoelectric plate 510 to form device 705.

At 7600, top metal deposition and patterning are performed on device 705 similar to forming contacts 546 step 5600. At 7600, top metal deposition and patterning are performed on device 705 to form contacts 546 and device 706.

At 7650, the PSG layer 740 of cavity material is released. At 7650, layer 740 is removed from device 706 to form device 506. Layer 740 may be released using a low pressure vapor hydrofluoric acid (HF) etch process, sulfur hexafluoride SF6 plasma etching, or wet HF etching for removing PSG. Releasing cavity material 740 forms cavity 540 from cavities 525 and 535.

At 7700, post-fabrication tuning is performed by ion milling 547 of device 506 similar to tuning at step 5700. At 7700, ion milling of contacts 546 and/or surface 538 may be performed on device 506 to form device 507.

At 7800, post-fabrication tuning is performed using dielectric layer 549 (e.g., SiO2) deposition and patterning of device 507 as noted at 5800.

Figure 8:
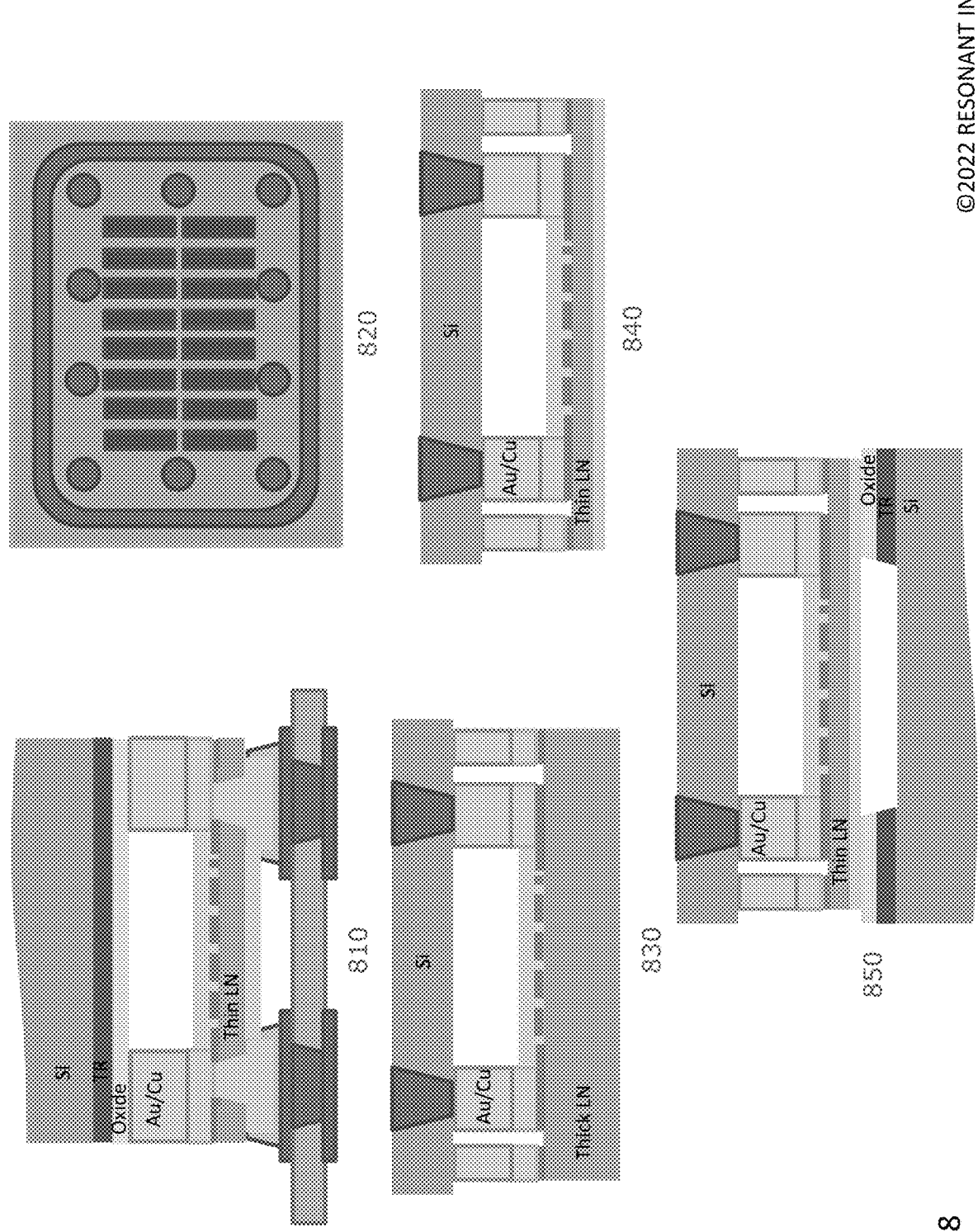
FIG. 8 shows a Wafer-to-Wafer (by D-Process)—Process Flow A—Metal Cavity Double Bond WLP.

FIG. 8 shows a Wafer-to-Wafer (by D-Process)—Process Flow A—Metal Cavity Double Bond WLP process 800. Process 800 may replace process 500 by forming package on the back surface of the PZ plate and bonding the substrate to the top surface of the plate. Process 800 may be used with or as part of any of processes 500-700. In some cases, the back of the diaphragm 515 facing away from the cavity of any of processes 500-700 must be covered as shown in FIG. 8, so that the diaphragm can vibrate and move in the up and down directions without contacting another surface above or below the diaphragm. One, more than one, or all steps of process 800 may occur before, during or after any of steps of processes 500-700. That is, steps of process 800 may be mixed in with those of any of processes 500-700.

Step 810 shows that surface mount technology (SMT) mounting on evaluation test board (EVB) will damage a thin LN membrane (e.g., plate 510) with heat and/or solder. This is a possibility with device 508 one the package shown in the lower part of 810 is mounted onto device 508. SMT is "surface mount technology", a method in which the electrical components are mounted directly onto the surface of a printed circuit board (PCB). The mounting is usually with solder and reflow. EVB is evaluation test board, which can be a test a PCB. Damage can occur when the device is flipped and mounted onto the PCB. The damage may be caused by 1) the mounting crashing the membrane onto the board (e.g., when the flip and mount is an automated process in production); or 2) during the reflow of the solder, the solder may creep and get onto the membrane and device layers.

Step 820 shows a Racetrack for hermetic package with I/O & GND TWV 820. Structure 820 can avoid some of the problems of the packaging in 810 resulting from SMT mounting on EVB that can damage a Thin LN membrane with heat or solder. The "racetrack" shown by the rectangular path around the edges of the figure may be a metal-metal seal ring around the perimeter of the entire filter, such as around a number of series and shunt resonators shown by the small rectangles in the middle of the figure that are forming a bandpass filter, and around the through wafer vias shown by the circles in the figure between the resonators and the racetrack. The racetrack may be a seal that provides mechanical attachment and prevents intrusion of humidity and other fluids and contaminants into the interior of the XBAR filters/resonators during mounting and packaging. The seal may be a distinct structure having a finite thickness which contributes to the total spacing between the diaphragms and the facing surfaces of the silicon layer interposer or package. The seal may be, for example, a thermocompression or ultrasonic bond between metal layers deposited on the piezoelectric plate and the interposer, a polymer or adhesive bond, a eutectic or solder bond, a glass frit bond, or some other bonding method and structure. Alternatively, the seal may be a bond, such as a plasma activated or surface activated wafer bond, directly between the interposer and the piezoelectric plate. The thickness of the seal may be negligible. The seal may be present around the entire perimeter of the packaged XBAR bandpass filter.

Step 830 shows first steps for a Racetrack for hermetic package with I/O & GND TWV 820. Steps 830 include: Resonator formation on Thick LN; Wafer to Wafer Bonding; and TWV Formation. Here, instead of metal-to-metal bonding of device 501 and 502, a package having a silicon wafer and through wafer vias is wafer-to-wafer bonded to the second metal, M2 layer on the front surface of the PZ plate of device 501 to provide electrical signal and ground contacts. Before bonding, the TWVs may be formed in the silicon wafer and bonding may include aligning the TWVs with proper locations of the M2 layer. The next step may be formation of the gold metal pillars on the silicon wafer for the metal-to-metal bonding to the M2 layer.

Step 840 shows second steps for a Racetrack for hermetic package with I/O & GND TWV 820. Steps 840 include: LN Thinning; LN Trimming to achieve the desired LN thickness; and Passivation & Trimming to fine tune the resonance and antiresonance frequency of the device (Optional). Here, similar to step 5400 and 5700 the PZ plate is thinned and trimmed (e.g., tuned); and similar to step 5800 post fabrication tuning by dielectric deposition is performed.

Step 850 shows third steps for a Racetrack for hermetic package with I/O & GND TWV 820. Steps 850 include: Bonding of Patterned Trap Rich Si; Singulation; and Tape & Reel. Here, a bit similar to step 6300, back instead of front surfaces of device 501 already having a dielectric layer are bonded to a device similar to device 603 without metal layer 631. In some cases, the cavity below the plate is one of cavities 540, 640 or 740 and the cavity above the plate is a cavity in the package that is provided so the plate is sealed in and away from the elements and has space to vibrate up and down. This seal will avoid any solder flux or moisture on the back of the diaphragm shifting the frequency of the filter.

Figure 9:
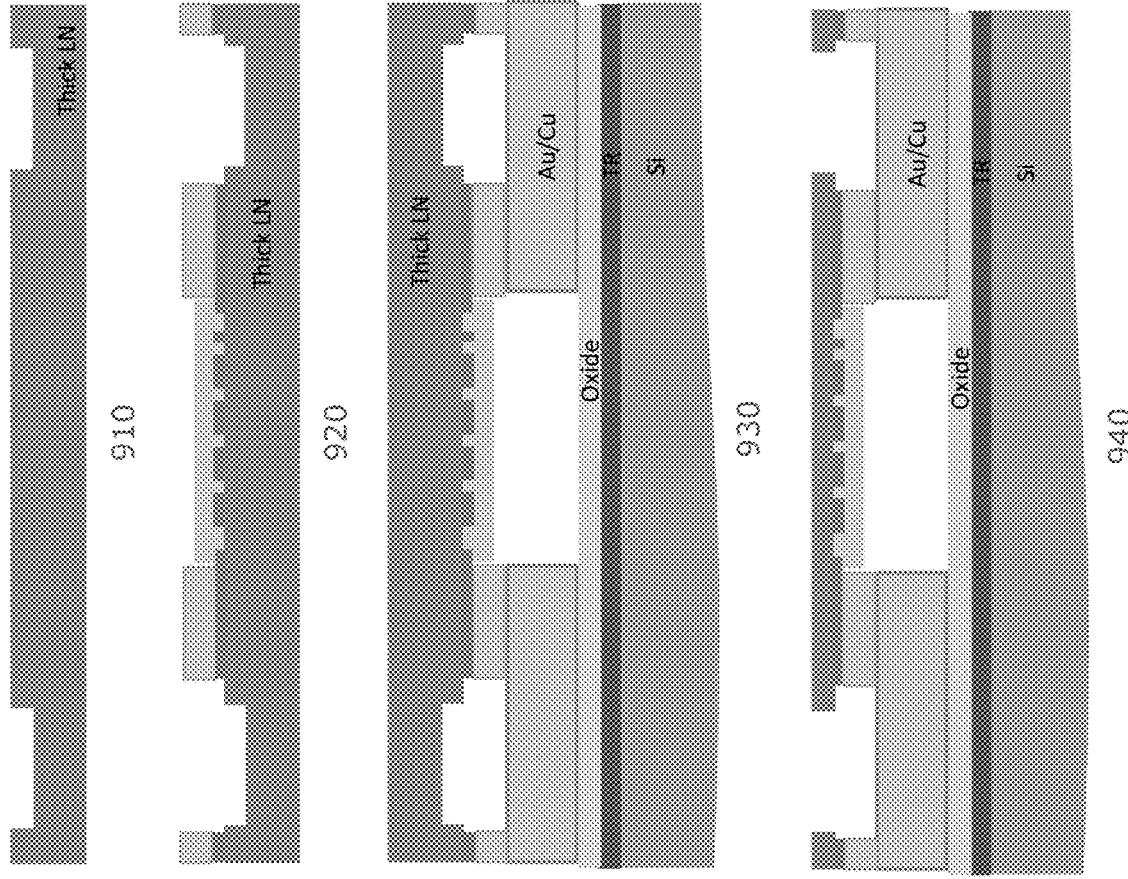
FIG. 9 shows a LN Hole Formation process for FIGS. 5 and 6.

FIG. 9 shows a LN Hole Formation process 900 for Step 5500 or 6500 in Process 500 or 600. Process 900 may replace steps 5500 or 6500. Process 900 may replace step 5100 plate 511 with plate of step 940.

Step 910 shows that wafer 511 may be masked and etched to form cavities at locations for contacts 546 prior to the wafer 511 having M1, M2 and passivation formed at step 5100.

Step 920 shows forming of M1, M2 and passivation such as describe at step 5100 onto the etched surface of the wafer of step 910.

Step 930 shows metal-to-metal bonding of the step 920 version of layer 501 to layer 502. Cavity 540 is formed by the bonding. This may be a flip-chip or flip-wafer bonding as noted at step 5300.

Then, step 940 shows a Grind and polish LN wafer to target thickness and expose etched cavities process. Step 940 may include thinning the wafer 511 to form plate 510 as noted at step 5400. Thinning at 940 removes a sufficient thickness of the wafer to expose the cavities formed at 910, thus creating the openings 544. Openings 544 are created after Grind and polish of the LN wafer to target thickness.

Although the description herein relate to an XBAR filter, the same concepts can be applied to a filter that each of one, some or all of the XBARs with a surface acoustic wave resonator (SAW), a bulk acoustic wave (BAW) resonator, a film bulk acoustic wave (FBAW) resonator, a temperature compensated surface acoustic wave resonator (TC-SAW), or a solidly-mounted transversely-excited film bulk acoustic resonator (SM-XBAR).

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

The invention claimed is:

1. A method of fabricating an acoustic resonator device having a metal cavity, the method comprising:

forming a first metal layer on a substrate;

forming a first cavity in the first metal layer;

forming a second metal layer on a piezoelectric plate having a conductor pattern including interleaved interdigital transducer (IDT) fingers;

forming a second cavity in the second metal layer;

bonding the first metal layer to the second metal layer using a metal-to-metal bond such that the first cavity is vertically aligned with the second cavity and such that the interleaved IDT fingers are disposed over the first cavity and the second cavity.

2. The method of claim 1, further comprising:

after bonding, thinning a piezoelectric wafer to form the piezoelectric plate, such that a portion of the piezoelectric plate forms a diaphragm that spans the first cavity.

3. The method of claim 1, further comprising:

prior to forming the first metal layer, forming the IDT on a back surface of the piezoelectric plate such that interleaved fingers of the IDT are disposed on the diaphragm, the piezoelectric plate and the IDT configured such that a radio frequency signal applied to the IDT excites a primary shear acoustic mode within the diaphragm.

4. The method of claim 1, further comprising:

forming a dielectric layer over the interleaved IDT fingers and the back surface of the portion of the piezoelectric plate that spans the first cavity.

5. An acoustic resonator comprising:

a plurality of series resonators comprising:

a first piezoelectric layer that includes a portion that is over a cavity in a metal layer over a substrate;

a first interdigital transducer on a surface of the first piezoelectric layer, the first interdigital transducer including interleaved fingers on the portion of the first piezoelectric layer that is over the cavity in the metal layer; and a metal-to-metal bond configured to bond the first piezoelectric layer to the metal layer such that the interleaved fingers of the first IDT are disposed over the cavity; and a plurality of shunt resonators comprising:

a second piezoelectric layer that includes a portion that is over a cavity in a metal layer over a substrate, the second piezoelectric layer being different than the first piezoelectric layer;

a second interdigital transducer on a surface of the second piezoelectric layer, the second interdigital transducer including interleaved fingers on the portion of the second piezoelectric layer that is over the cavity in the metal layer; and a metal-to-metal bond configured to bond the second piezoelectric layer to the metal layer such that the interleaved fingers of the second IDT are disposed over the cavity, wherein the plurality of series resonators and the plurality of shunt resonators configure a band-pass filter.

6. The device of claim 5, further comprising a dielectric layer over the interleaved fingers of at least the first IDT and a surface of the portion of the first piezoelectric layer that is over the cavity in the metal layer.

7. The device of claim 5, wherein the first interdigital transducer and the interleaved fingers are on the surface of the first piezoelectric layer that faces the metal layer, such that the interleaved fingers are within the cavity.

8. The device of claim 5, further comprising:

a plurality of openings that extend through the piezoelectric layer; and conductor material in the plurality of openings and configured as contact vias or pads for the interdigital transducer of the first IDT.

9. An acoustic resonator device comprising:

a piezoelectric layer having front and back surfaces, the back surface attached to a first metal layer having a first cavity except for a portion of the piezoelectric layer that forms a diaphragm that is over the first cavity;

a substrate having front and back surfaces, the front surface of the substrate attached to a second metal layer having a second cavity except for a portion of the substrate that spans the second cavity; and an interdigital transducer (IDT) on the front surface of the piezoelectric layer such that interleaved fingers of the IDT are disposed on the diaphragm.

10. The device of claim 9, further comprising a metal-to-metal bond configured to bond the first metal layer to the second metal layer such that the interleaved fingers of the IDT are disposed over at least one of the first cavity and the second cavity.

11. The device of claim 9, wherein the piezoelectric layer and the IDT are configured such that a radio frequency signal applied to the IDT excites a primary shear acoustic mode within the diaphragm, the excited primary shear acoustic mode being a bulk shear mode in which acoustic energy propagates along a direction substantially orthogonal to the front and back surfaces of the piezoelectric layer, which is also normal to a direction of an electric field generated by the interleaved fingers of the IDT.

* * * * *